(12) United States Patent
Kawashima

(10) Patent No.: US 11,107,761 B2
(45) Date of Patent: *Aug. 31, 2021

(54) SEMICONDUCTOR DEVICE

(71) Applicant: DENSO CORPORATION, Kariya (JP)

(72) Inventor: Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,710

(22) Filed: Jan. 22, 2019

(65) Prior Publication Data
US 2019/0244888 A1    Aug. 8, 2019

(30) Foreign Application Priority Data

Feb. 6, 2018  (JP) .............................. JP2018-019594
Apr. 11, 2018  (JP) .............................. JP2018-076188

(51) Int. Cl.
*H01L 23/498*     (2006.01)
*H01L 23/495*     (2006.01)
(Continued)

(52) U.S. Cl.
CPC .. *H01L 23/49861* (2013.01); *H01L 23/49524* (2013.01); *H01L 23/49811* (2013.01);
(Continued)

(58) Field of Classification Search
CPC ....... H01L 23/49524; H01L 23/49541–49565; H01L 25/042; H01L 25/0652;
(Continued)

(56) References Cited

U.S. PATENT DOCUMENTS 5,691,884 A * 11/1997 Soyano .................. H01L 23/24
257/787
7,224,145 B2 * 5/2007 Pierret .................... F02N 11/04
322/25
(Continued)

FOREIGN PATENT DOCUMENTS

JP         5914867 B2     4/1984
JP     2010034347 A  *  2/2010
(Continued)

OTHER PUBLICATIONS

Korean written opinion of KR10-2019-0012363 (Year: 2020).*
(Continued)

*Primary Examiner* — Vincent Wall
(74) *Attorney, Agent, or Firm* — Oliff PLC

(57) ABSTRACT

A semiconductor device may include a first conductive plate, a plurality of semiconductor chips disposed on the first conductive plate, and a first external connection terminal connected to the first conductive plate. The plurality of semiconductor chips may include first, second, and third semiconductor chips. The second semiconductor chip may be located between the first semiconductor chip and the third semiconductor chip. A portion of the first conductive plate where the first external connection terminal is connected may be closest to the second semiconductor chip among the first, second, and third semiconductor chips. The first conductive plate may be provided with an aperture located between the portion of the first conductive plate where the first external connection terminal is connected and a portion of the first conductive plate where the second semiconductor chip is connected.

25 Claims, 19 Drawing Sheets

(51) Int. Cl.
*H01L 23/00* (2006.01)
*H01L 25/07* (2006.01)
*H01L 25/10* (2006.01)
*H01L 25/11* (2006.01)

(52) U.S. Cl.
CPC ........ *H01L 23/49822* (2013.01); *H01L 24/49* (2013.01); *H01L 25/072* (2013.01); *H01L 23/49562* (2013.01); *H01L 23/49575* (2013.01); *H01L 25/105* (2013.01); *H01L 25/117* (2013.01); *H01L 2224/04042* (2013.01); *H01L 2224/291* (2013.01); *H01L 2224/32225* (2013.01); *H01L 2224/32245* (2013.01); *H01L 2224/33181* (2013.01); *H01L 2224/48247* (2013.01); *H01L 2224/73215* (2013.01); *H01L 2224/73265* (2013.01); *H01L 2225/1023* (2013.01); *H01L 2225/1029* (2013.01); *H01L 2924/00014* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01); *H01L 2924/15151* (2013.01)

(58) Field of Classification Search
CPC . H01L 25/0655; H01L 25/071; H01L 25/072; H01L 25/0753; H01L 25/115
See application file for complete search history.

(56) References Cited

U.S. PATENT DOCUMENTS

| | | | | |
|---|---|---|---|---|
| 7,843,700 | B2* | 11/2010 | Fukuda | H01L 23/49575 |
| | | | | 361/760 |
| 8,884,411 | B2* | 11/2014 | Kadoguchi | H01L 23/49548 |
| | | | | 257/666 |
| 9,325,257 | B2* | 4/2016 | Okayama | H01L 24/49 |
| 10,236,806 | B2* | 3/2019 | Holzer | B60L 15/007 |
| 2007/0057373 | A1* | 3/2007 | Okumura | H01L 23/49575 |
| | | | | 257/746 |
| 2009/0231811 | A1 | 9/2009 | Tokuyama et al. | |
| 2010/0084183 | A1* | 4/2010 | Ishida | H01L 23/49575 |
| | | | | 174/520 |
| 2015/0131232 | A1 | 5/2015 | Ishino et al. | |
| 2015/0155797 | A1 | 6/2015 | Okayama | |
| 2016/0064312 | A1* | 3/2016 | Bando | H01L 23/49524 |
| | | | | 438/119 |
| 2017/0278774 | A1* | 9/2017 | Hayashi | H01L 23/4334 |
| 2017/0287821 | A1* | 10/2017 | Choi | H01L 23/3735 |
| 2018/0218960 | A1* | 8/2018 | Takahagi | H01L 23/4334 |
| 2018/0226383 | A1 | 8/2018 | Yamaguchi | |
| 2018/0366409 | A1* | 12/2018 | Kuwabara | H01L 25/0655 |
| 2019/0221490 | A1* | 7/2019 | Fujita | H01L 24/49 |
| 2019/0221549 | A1* | 7/2019 | Hayashi | H01L 23/49524 |
| 2019/0237453 | A1* | 8/2019 | Nagase | H01L 25/18 |
| 2019/0244888 | A1* | 8/2019 | Kawashima | H01L 25/072 |
| 2019/0318999 | A1* | 10/2019 | Kawashima | H01L 23/49537 |

FOREIGN PATENT DOCUMENTS

| | | | | |
|---|---|---|---|---|
| JP | 2013-93343 | A | | 5/2013 |
| JP | 2014-011338 | A | | 1/2014 |
| JP | 5551808 | B2 | | 7/2014 |
| JP | 2014-183078 | A | | 9/2014 |
| JP | 2016197706 | A | * | 11/2016 ........... H01L 23/293 |
| JP | 2017-28105 | A | | 2/2017 |
| JP | 2017-224751 | A | | 12/2017 |
| JP | 2018-67657 | A | | 4/2018 |
| JP | 2018067657 | A | * | 4/2018 |

OTHER PUBLICATIONS

Cottet et al., "Numerical Comparison of Packaging Technologies for Power Electronics Modules", Power Electronics Specialist Conference 2005, PESO '05, IEEE 36th, IEEE, Piscataway NJ, pp. 2187-2193, doi: 10.1109/PESC.2005.1581936, Jan. 1, 2005 (Year: 2005).*
U.S. Appl. No. 16/285,837, filed Feb. 26, 2019 in the name of Kawashima.
Feb. 21, 2020 Office Action issued in U.S. Appl. No. 16/285,837.
Aug. 19, 2020 Office Action issued in U.S. Appl. No. 16/285,837.
Nov. 25, 2020 Notice of Allowance issued in U.S. Appl. No. 16/285,837.

* cited by examiner

SEMICONDUCTOR DEVICE

CROSS-REFERENCE

This application claims priority to Japanese Patent Application No. 2018-019594, filed on Feb. 6, 2018 and Japanese Patent Application No. 2018-076188, filed on Apr. 11, 2018, the entire contents of which are incorporated herein by reference.

TECHNICAL FIELD

The description herein relates to a semiconductor device.

BACKGROUND

Japanese Patent Application Publication No. 2013-93343 describes a semiconductor device. This semiconductor device includes a conductive plate, a plurality of semiconductor chips disposed on the conductive plate, and an external connection terminal connected to the conductive plate.

SUMMARY

In a semiconductor device having a plurality of semiconductor chips connected in parallel, it is desirable for a current to flow to each of the semiconductor chips equally. However, when three or more semiconductor chips are disposed on a common conductive plate, distances between an external connection terminal connected to the conductive plate and the respective semiconductor chips do not match completely. For example, on the common conductive plate, it is assumed that three semiconductor chips are disposed linearly. In this case, no matter which location on the conductive plate the external connection terminal is connected, the distances between the external connection terminal and the respective semiconductor chips cannot be made equal. When such differences in the distances exist, non-negligible differences occur in electric resistances between the external connection terminal and the respective semiconductor chips. As a result, currents flow unequally to the respective semiconductor chips. The disclosure herein provides a technique that can solve or improve such a problem.

A semiconductor device disclosed herein may comprise a first conductive plate, a plurality of semiconductor chips disposed on the first conductive plate and a first external connection terminal connected to the first conductive plate. The plurality of semiconductor chips includes first, second and third semiconductor chips. The second semiconductor chip is located between the first semiconductor chip and the third semiconductor chip. A portion of the first conductive plate where the first external connection terminal is connected is closest to the second semiconductor chip among the first, second and third semiconductor chips. The first conductive plate is provided with an aperture located between the portion of the first conductive plate where the first external connection terminal is connected and a portion of the first conductive plate where the second semiconductor chip is connected.

In the aforementioned semiconductor device, a distance from the first external connection terminal to the second semiconductor chip becomes shorter than a distance from the first external connection terminal to the first semiconductor chip and a distance from the first external connection terminal to the third semiconductor chip. Thus, the first conductive plate is provided with the aperture between the portion where the first external connection terminal is connected and the portion where the second semiconductor chip is connected. Due to this, at least a part of a current flowing between the first external connection terminal and the second semiconductor chip needs to flow by skirting around the aperture, and an electric resistance thereof increases as a result of a length of a passage through which the current actually flows becoming longer. As a result, the current flowing in the second semiconductor chip is suppressed, and inequality in the currents flowing in the respective semiconductor chips is resolved or reduced. The aperture described herein is not limited to a penetrating aperture.

DETAILED DESCRIPTION

Figure 1:
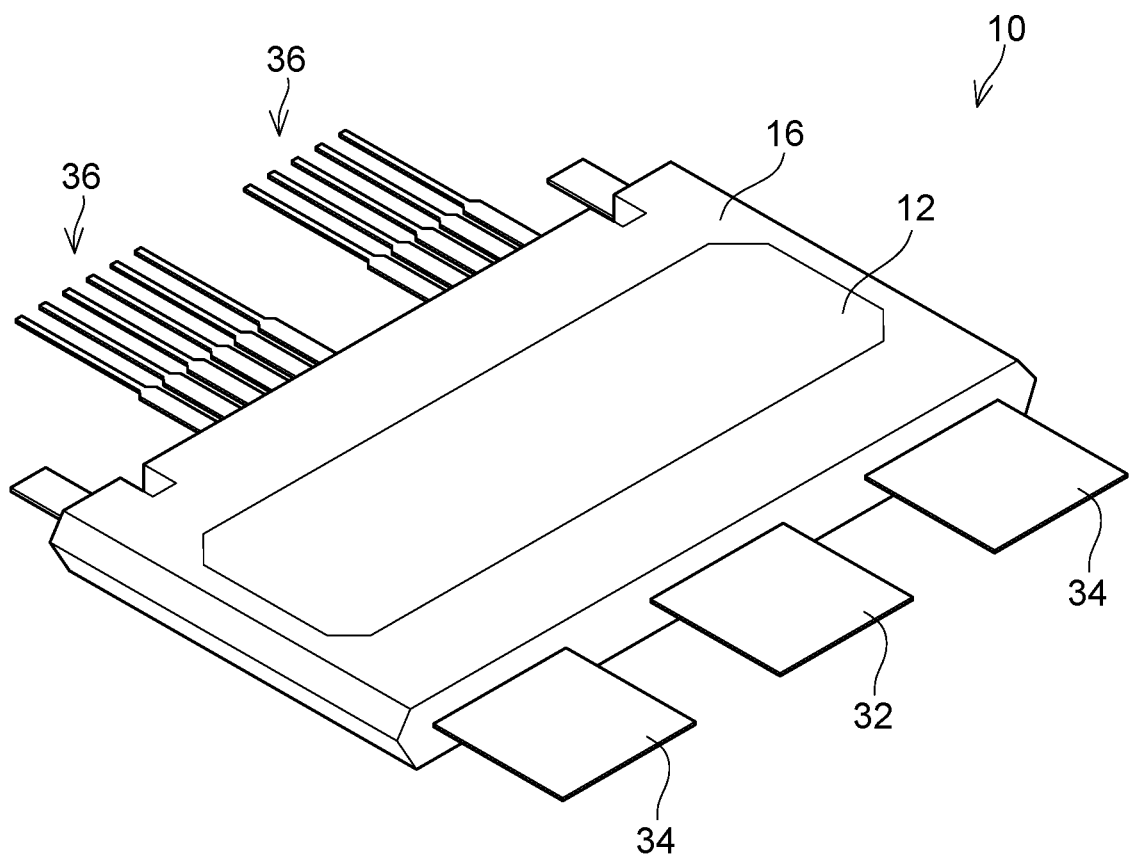
FIG. 1 is a perspective view showing an outer appearance of a semiconductor device 10.
Figure 2:
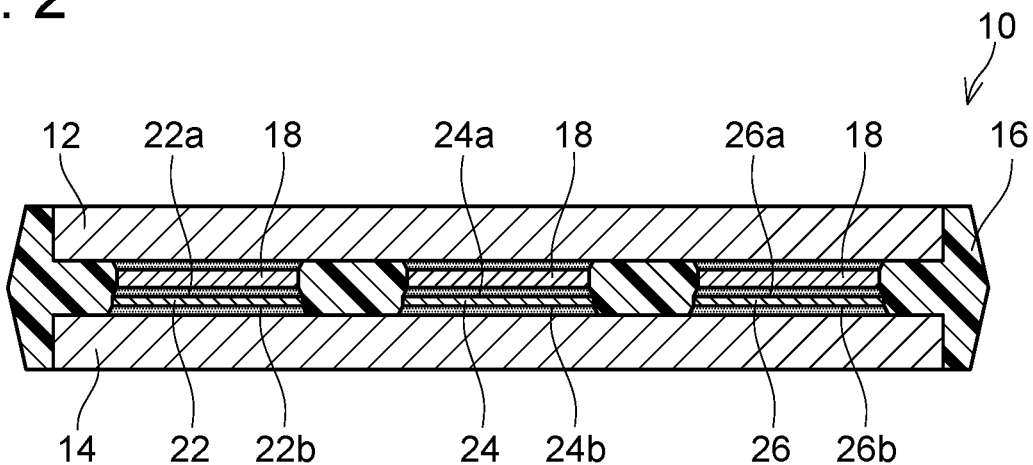
FIG. 2 is a diagram showing a cross-sectional structure of the semiconductor device 10. The cross-sectional structure is of a cross section perpendicular to a symmetry plane PS shown in FIG. 5.

In an embodiment of the present technique, the aforementioned aperture may be configured such that all current flowing between a first external connection terminal and a second semiconductor chip skirts around the aperture. With such a configuration, an electric resistance between the first external connection terminal and the second semiconductor chip can be sufficiently increased.

In an embodiment of the present technique, an arrangement of first, second, and third semiconductor chips may be substantially symmetric (that is, plane symmetric) about a plane, which is termed a symmetry plane, that is perpendicular to the first conductive plate and passes through the second semiconductor chip. According to such a configuration, inequality in currents flowing in the respective semiconductor chips can be sufficiently reduced between the first semiconductor chip and the third semiconductor chip. Being substantially symmetric as described herein means that a certain tolerance (for example, an error of half or less a size of the semiconductor chip (a so-called chip size)) is allowed as compared to an arrangement that is accurately symmetric.

In an embodiment of the present technique, the symmetry plane may intersect with the portion of the first conductive plate where the first external connection terminal is connected. According to this configuration, a distance from the first external connection terminal to the first semiconductor chip and a distance from the first external connection terminal to the third semiconductor chip can be made equal to each other. Due to this, the currents flowing in the respective semiconductor chips can be substantially equalized between the first semiconductor chip and the third semiconductor chip.

In an embodiment of the present technique, the aperture may have a mouth that is symmetric about the symmetry plane. According to this configuration, symmetry between the first semiconductor chip and the third semiconductor chip can be avoided being lost due to a presence of the aperture.

In an embodiment of the present technique, the aperture may have a shape of slot. A longitudinal axis of the slot may be perpendicular to the symmetry plane. According to this configuration, design and manufacture of a suitable aperture can easily be performed. However, a shape of the mouth of the aperture is not limited to a simple slot shape, and may be a more complicated shape.

In an embodiment of the present technique, in a direction perpendicular to the symmetry plane, a dimension of the aperture may be larger than a dimension of the second semiconductor chip. According to this configuration, although it will depend on a dimension of the first external connection terminal, most of or all of a current flowing between the first external connection terminal and the second semiconductor chip can be made to skirt around the aperture.

In an embodiment of the present technique, in a direction perpendicular to the symmetry plane, a dimension of the aperture may be smaller than a distance between a center of the first semiconductor chip and a center of the third semiconductor chip. According to this configuration, the current flowing between the first external connection terminal and the second semiconductor chip can be avoided excessively skirting around the aperture.

In an embodiment of the present technique, the portion of the first conductive plate where the first external connection terminal is connected may be symmetric about the symmetry plane. According to this configuration, the symmetry between the first semiconductor chip and the third semiconductor chip can further be improved.

In an embodiment of the present technique, in a direction perpendicular to the symmetry plane, a dimension of the aperture may be larger than the portion of the first conductive plate where the first external connection terminal is connected. According to this configuration, although it will depend on a dimension of the second semiconductor chip, most of or all of the current flowing between the first external connection terminal and the second semiconductor chip can be made to skirt around the aperture.

In an embodiment of the present technique, the first conductive plate may comprise an expanded portion, a dimension of which in a direction perpendicular to the symmetry plane becomes larger from the portion of the first conductive plate where the first external connection terminal is connected towards a portion of the first conductive plate where the plurality of semiconductor chips is connected. In this case, the aperture may at least partly be located within the expanded portion. According to this configuration, a relatively large-sized aperture may be provided. Further, by providing such an expanded portion, a current passage between the first external connection terminal and the first semiconductor chip and a current passage between the first external connection terminal and the third semiconductor chip can be shortened, by which an electric loss in the semiconductor device can be reduced.

In an embodiment of the present technique, the first, second, and third semiconductor chips may be arranged linearly along a direction perpendicular to the symmetry plane. According to this configuration, since the arrangement of the plurality of semiconductor chips is simple, the aperture may have a simple configuration, for example.

In an embodiment of the present technique, the semiconductor device may further comprise a second conductive plate opposed to the first conductive plate and connected to each of the plurality of semiconductor chips. In this case, although not particularly limited, the semiconductor device may further comprise at least one second external connection terminal connected to the second conductive plate. The technique disclosed herein may be applied to semiconductor devices with various structures, regardless of numbers of conductive plates and external connection terminals.

In the aforementioned embodiment, the at least one second external connection terminal may include two second external connection terminals. In this case, one of the two second external connection terminals may be connected to the second conductive plate on one side relative to the symmetry plane. Further, another one of the two second external connection terminals may be connected to the second conductive plate on another side relative to the symmetry plate. In this case, although no particularly limited, the two second external connection terminals may be arranged substantially symmetric about the symmetry plane. According to this configuration, the inequality of the currents flowing in the respective semiconductor chips can be reduced in the second conductive plate as well.

In an embodiment of the present technique, in a plan view along a direction perpendicular to the first and second conductive plates, an area of the second conductive plate may be larger than an area of the first conductive plate. According to this configuration, when the first conductive plate is to be assembled to the second conductive plate upon manufacture of the semiconductor device, the first conductive plate can be supported by a tool set up around the second conductive plate to determine positions of the first and second conductive plates. Further, when an area of an electrode (such as a collector) of a semiconductor chip to be connected to the second conductive plate is larger than an area of an electrode (such as an emitter) of a semiconductor chip to be connected to the first conductive plate, heat dissipating performance from the semiconductor chip can be enhanced by the area of the first conductive plate being larger than the area of the second conductive plate.

In an embodiment of the present technique, the first conductive plate may comprise an expanded portion, and in a plan view along a direction perpendicular to the first and second conductive plates, a width of the expanded portion may become larger from the portion of the first conductive plate where the first external connection terminal is connected towards a portion of the first conductive plate where the plurality of semiconductor chips is connected. According to this configuration, the current passage between the first external connection terminal and the first semiconductor chip and the current passage between the first external connection terminal and the third semiconductor chip can be shortened, by which the electric loss in the semiconductor device can be reduced.

In the aforementioned embodiment, a thickness of the expanded portion of the first conductive plate may be smaller than a thickness of the portion of the first conductive plate where the plurality of semiconductor chips is connected. In this case, the expanded portion of the first conductive plate may be covered by an encapsulant. When the expanded portion of the first conductive plate is covered by the encapsulant, a creeping distance along a surface of the encapsulant becomes longer between the expanded portion of the first conductive plate and the second external connection terminal connected to the second conductive plate, by which insulation performance can be enhanced.

In the aforementioned embodiment, at least a part of the expanded portion may face the at least one second external connection terminal. In the expanded portion connected to the first external connection terminal, a current flows in an opposite direction from that in the second external connection terminal. Thus, when at least a part of the expanded portion faces the second external connection terminal, inductances in the current passages can be reduced by magnetic fields generated by electric conduction cancelling out each other.

In the aforementioned embodiment, each of the first, second, and third semiconductor chips may comprise an IGBT (Insulated Gate Bipolar Transistor) provided with an emitter and a collector. In this case, the emitters may be electrically connected to the first conductive plate and the collectors may be electrically connected to the second conductive plate. However, in another embodiment, each of the first, second, and third semiconductor chips may be another semiconductor chip, such as a MOSFET (Metal-Oxide-Semiconductor Field-Effect Transistor) or a diode.

In an embodiment of the present technique, the first conductive plate may be an insulated substrate comprising an inner conductor layer, an outer conductor layer, and an insulator layer disposed between the inner conductor layer and the outer conductor layer. In this case, the first external connection terminal may be electrically connected to the plurality of semiconductor chips via the inner conductor layer. Further, the aforementioned aperture may be provided in the inner conductor layer. When the first conductive plate is the insulated substrate, the inner conductor layer can be configured in a free profile. For example, in a case where the first conductive plate is opposed to the second conductive plate, an impedance of the semiconductor device can be reduced by increasing an area by which the inner conductor layer opposes the second conductive plate.

In the aforementioned embodiment, the aperture may be provided only in the inner conductor layer, and may comprise a bottom surface defined by the insulator layer. According to this configuration, rigidity of the first conductive plate can be avoided being decreased due to the presence of the aperture. Further, the inner conductor layer and the outer conductor layer can be avoided unintentionally becoming electrically conducted.

In an embodiment of the present technique, the second conductive plate may be an insulated substrate comprising an inner conductor layer, an outer conductor layer, and an insulator layer disposed between the inner conductor layer and the outer conductor layer. In this case, the at least one second external connection terminal may be electrically connected to the plurality of semiconductor chips via the inner conductor layer of the second conductive plate. According to this configuration, the inner conductor layer of the first conductive plate and the inner conductor layer of the second conductive plate can be caused to oppose each other over a larger area, by which the impedance of the semiconductor device can further be reduced.

In each of the insulated substrates of the aforementioned first conductive plate and/or second conductive plate, each of the inner conductor layer and the outer conductor layer may be a metal layer, and the insulator layer may be a ceramic substrate. In this case, the insulated substrate may be a DBC (Direct Bonded Copper) substrate.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

A semiconductor device 10 according to an embodiment will be described with reference to the drawings. The semiconductor device 10 may be employed in a power conversion circuit, such as a converter or an inverter, in an electric vehicle, for example. The electric vehicle described herein refers to a wide variety of vehicles having motor(s) for driving wheel(s), and includes, for example, an electric vehicle charged by external power, a hybrid vehicle including an engine in addition to the motor, and a fuel cell vehicle having a fuel cell as its power source.

Figure 3:
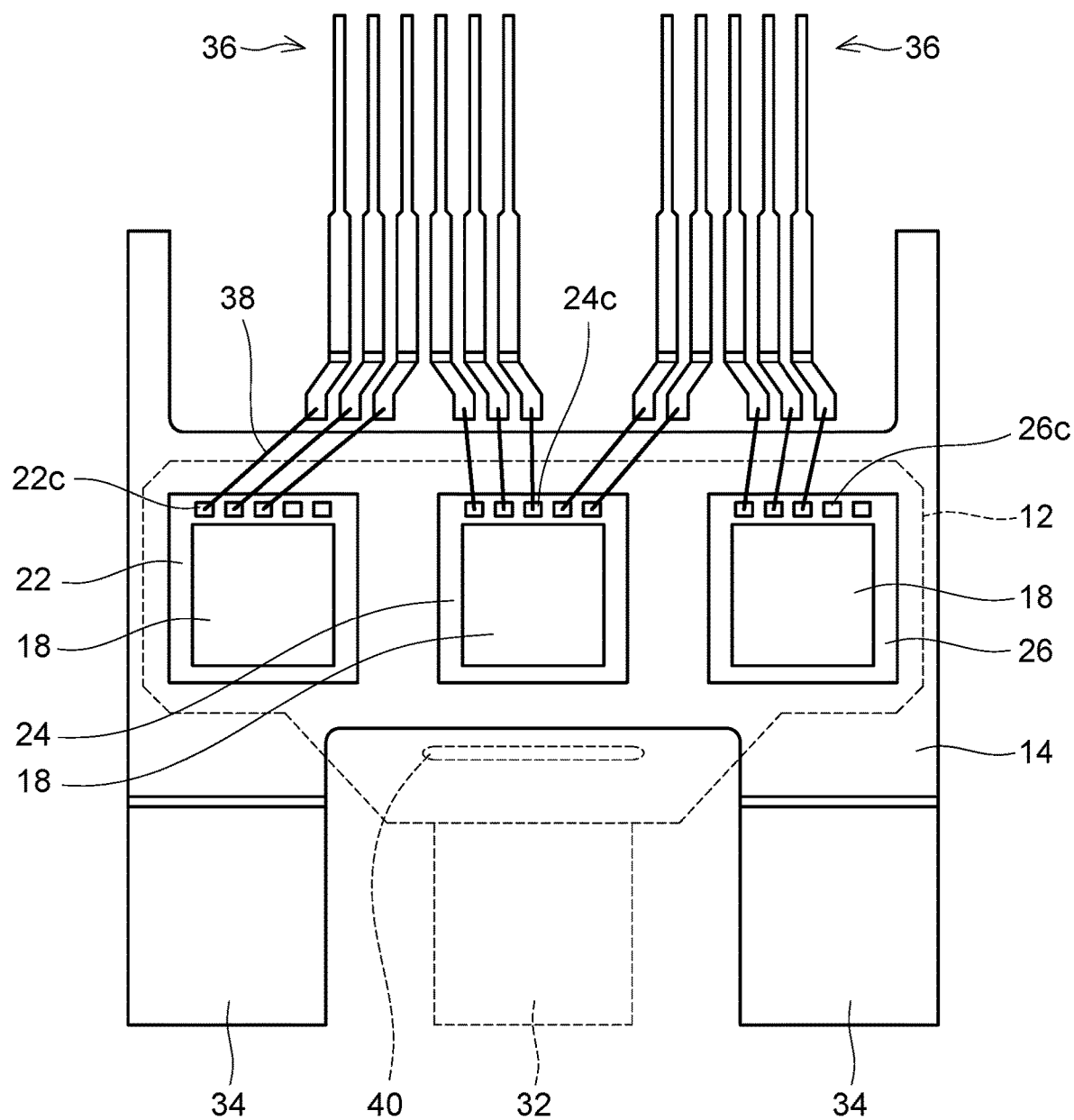
FIG. 3 is a plan view showing an internal structure of the semiconductor device 10 with depiction of some of constituent features thereof omitted.
Figure 4:
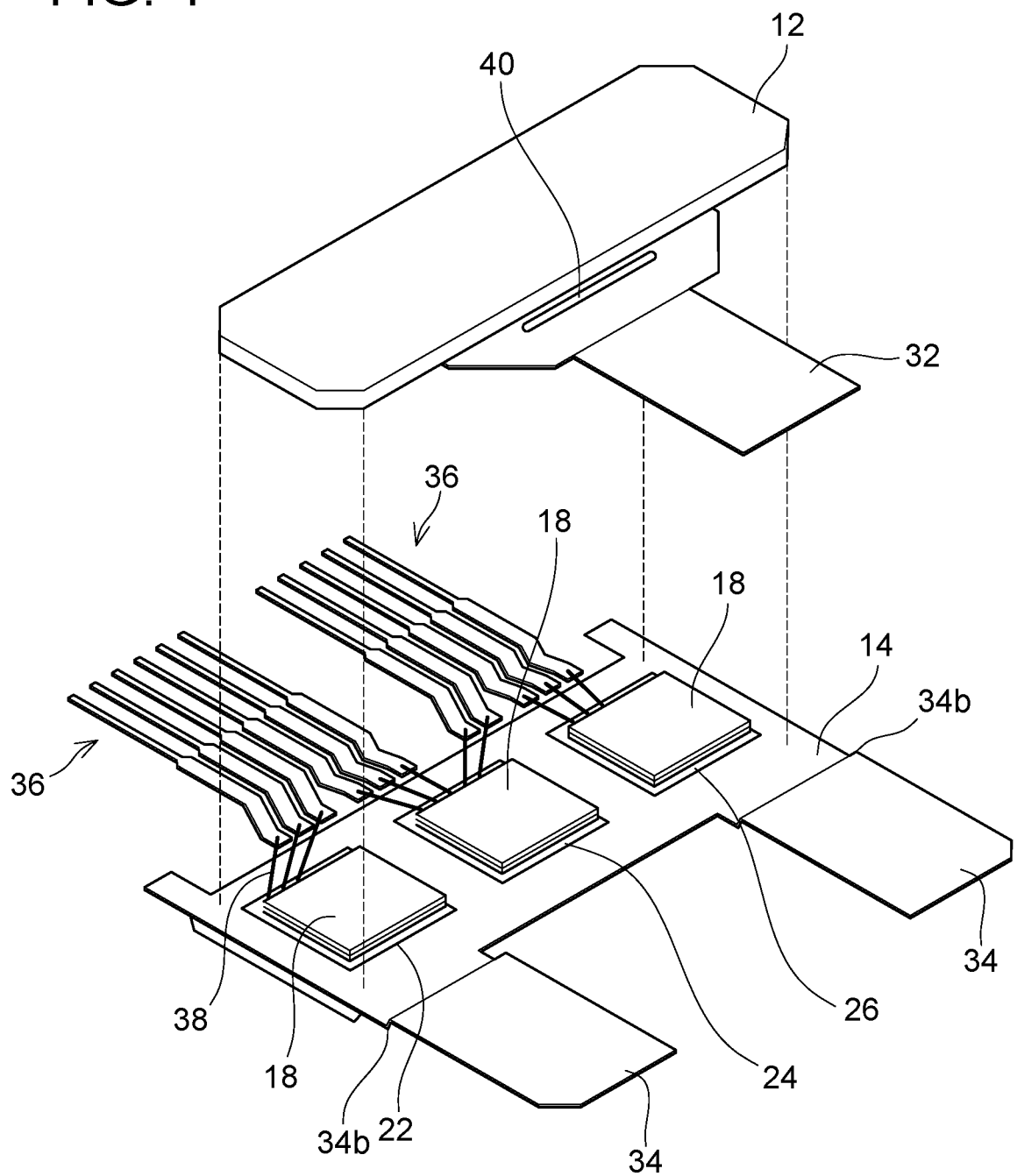
FIG. 4 is a disassembled diagram showing the internal structure of the semiconductor device 10 with depiction of some of constituent features thereof omitted.

As shown in FIGS. 1 to 4, the semiconductor device 10 includes a first conductive plate 12, a second conductive plate 14, a plurality of semiconductor chips 22, 24, 26, and an encapsulant 16. The semiconductor device 10 also includes an aperture 40 as shown in FIGS. 3 and 4. The first conductive plate 12 and the second conductive plate 14 are parallel to each other and are opposed to each other. Although this is merely an example, the plurality of semiconductor chips 22, 24, 26 includes a first semiconductor chip 22, a second semiconductor chip 24, and a third semiconductor chip 26. The first semiconductor chip 22, the second semiconductor chip 24, and the third semiconductor chip 26 are arranged linearly along a longitudinal direction of the first conductive plate 12 and the second conductive plate 14 (a left-and-right direction in FIGS. 2 and 3). The plurality of semiconductor chips 22, 24, 26 is disposed in parallel between the first conductive plate 12 and the second conductive plate 14. The plurality of semiconductor chips 22, 24, 26 is encapsulated by the encapsulant 16.

The first conductive plate 12 and the second conductive plate 14 are constituted of conductors such as copper or other metal. The first conductive plate 12 and the second conductive plate 14 are opposed to each other with the plurality of semiconductor chips 22, 24, 26 interposed therebetween. Each of the semiconductor chips 22, 24, 26 is bonded to the first conductive plate 12, and is also bonded to the second conductive plate 14. A conductor spacer 18 is provided between each of the semiconductor chips 22, 24, 26 and the first conductive plate 12. Here, specific configurations of the first conductive plate 12 and the second conductive plate 14 are not particularly limited. For example, at least one of the first conductive plate 12 and the second conductive plate 14 may be an insulated substrate including an intermediate layer constituted of an insulator (for example, ceramic), such as a DBC (Direct Bonded Copper) substrate. That is, entirety of each of the first conductive plate 12 and the second conductive plate 14 may not necessarily be constituted of conductor.

The first semiconductor chip 22, the second semiconductor chip 24, and the third semiconductor chip 26 are so-called power semiconductor chips for power circuit, and they all have a same configuration. The first semiconductor chip 22 includes an upper electrode 22a, a lower electrode 22b, and a plurality of signal pads 22c. The upper electrode 22a and the lower electrode 22b are electrodes for power, and the plurality of signal pads 22c are electrodes for signals. The upper electrode 22a and the plurality of signal pads 22c are located on an upper surface of the first semiconductor chip 22, and the lower electrode 22b is located on a lower surface of the first semiconductor chip 22. The upper electrode 22a is electrically connected to the first conductive plate 12 via the conductor spacer 18, and the lower electrode 22b is electrically connected to the second conductive plate 14. Similarly, the second semiconductor chip 24 and the third semiconductor chip 26 respectively include upper electrodes 24a, 26a, lower electrodes 24b, 26b, and pluralities of signal pads 24c, 26c. The upper electrodes 24a, 26a are electrically connected to the first conductive plate 12 via the conductor spacers 18, and the lower electrodes 24b, 26b are electrically connected to the second conductive plate 14.

Although this is merely an example, each of the semiconductor chips 22, 24, 26 in the present embodiment includes an IGBT structure including an emitter and a collector. The emitters of the IGBT structures are connected to the upper electrodes 22a, 24a, 26a, and the collectors of the IGBT structures are connected to the lower electrodes 22b, 24b, 26b. However, specific types and structures of the semiconductor chips 22, 24, 26 are not particularly limited. Each of the semiconductor chips 22, 24, 26 may be an RC (Reverse Conducting)-IGBT element further including a diode structure. Alternatively, each of the semiconductor chips 22, 24, 26 may include, for example, a MOSFET (Metal-Oxide-Semiconductor Field-Effect Transistor) structure instead of or in addition to the IGBT structure. Further, semiconductor materials used in the semiconductor chips 22, 24, 26 are also not particularly limited, and for example, they may be silicon (Si), silicon carbide (SiC), or nitride semiconductor such as gallium nitride (GaN).

Although not particularly limited, the encapsulant 16 may be constituted of thermal curing resin such as epoxy resin or another insulator, for example. The encapsulant 16 may also be termed a mold resin or a package, for example. The semiconductor device 10 is not limited to include the three semiconductor chips 22, 24, 26, and may include a larger number of semiconductor chips. In this case as well, a plurality of semiconductor chips can be encapsulated in the single encapsulant 16, and can be disposed in parallel between the first conductive plate 12 and the second conductive plate 14.

The first conductive plate 12 and the second conductive plate 14 are not only electrically connected to the plurality of semiconductor chips 22, 24, 26, but are also thermally connected to the plurality of semiconductor chips 22, 24, 26. Further, the first conductive plate 12 and the second conductive plate 14 are respectively exposed at surfaces of the encapsulant 16, and thus can dissipate heat of the respective semiconductor chips 22, 24, 26 to outside of the encapsulant 16. Due to this, the semiconductor device 10 of the present embodiment includes a double-side cooling structure in which heat dissipating plates are disposed on both sides of the plurality of semiconductor chips 22, 24, 26.

The semiconductor device 10 further includes a first external connection terminal 32, two second external connection terminals 34, and eleven third external connection terminals 36. The semiconductor device 10 also includes a bent portion 34b between the second conductive plate 14 and the second external connection terminals 34. Each of the external connection terminals 32, 34, 36 is constituted of a conductor such as copper or aluminum, and extends from inside to outside of the encapsulant 16. The first external connection terminal 32 is connected to the first conductive plate 12 inside the encapsulant 16. Each of the second external connection terminals 34 is connected to the second conductive plate 14 inside the encapsulant 16. Due to this, the plurality of semiconductor chips 22, 24, 26 is connected electrically in parallel between the first external connection terminal 32 and each of the second external connection terminals 34. Each of the third external connection terminals 36 is connected to corresponding one of the signal pads 22c, 24c, 26c of the semiconductor chips 22, 24, 26 via a bonding wire 38. Although this is merely an example, the first external connection terminal 32 is bonded to the first conductive plate 12 by soldering, and each of the second external connection terminals 34 is integrated with the second conductive plate 14. However, the first external connection terminal 32 may be integrated with the first conductive plate 12. Further, each of the second external connection terminals 34 may be bonded to the second conductive plate 14 by soldering, for example. Further, each of the third external connection terminals 36 may be connected to its corresponding one of the signal pads 22c, 24c, 26c without intervention of the bonding wire 38.

Figure 5:
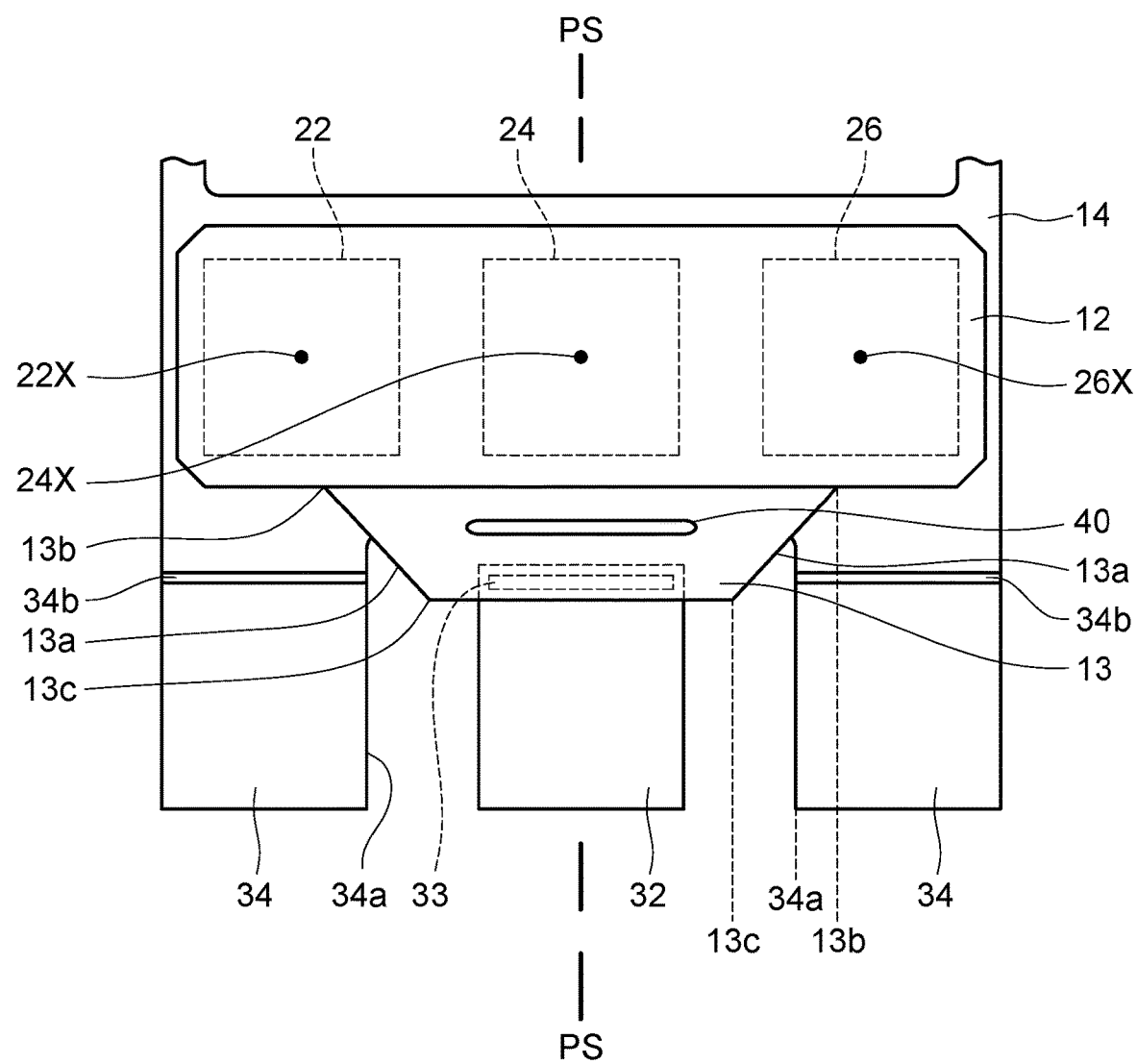
FIG. 5 shows a positional relationship between a plurality of semiconductor chips 22, 24, 26, a portion 33 where a first external connection terminal 32 is connected to a first conductive plate 12, and an aperture 40 provided in the first conductive plate 12.

As shown in FIG. 5, an arrangement of the first semiconductor chip 22, the second semiconductor chip 24, and the third semiconductor chip 26 is symmetric about a plane PS perpendicular to the first conductive plate 12 and passing through the second semiconductor chip 24 as a symmetry plane. Further, the first external connection terminal 32 is connected to the first conductive plate 12 at a portion 33 that intersects with the symmetry plane PS. This portion 33 is located closest to the second semiconductor chip 24 among the three semiconductor chips 22, 24, 26. According to this configuration, distances between the first external connection terminal 32 connected to the first conductive plate 12 and the respective semiconductor chips 22, 24, 26 do not exactly match. For example, the distance from the first external connection terminal 32 to the first semiconductor chip 22 and the distance from the first external connection terminal 32 to the third semiconductor chip 26 are equal to each other. However, the distance from the first external connection terminal 32 to the second semiconductor chip 24 is shorter than each of the distances from the first external connection terminal 32 to the first semiconductor chip 22 and to the third semiconductor chip 26. When such a difference in the distances is present, a non-negligible difference is generated in electric resistances between the first external connection terminal 32 and the respective semiconductor chips 22, 24, 26. As a result, currents flowing respectively in the semiconductor chips 22, 24, 26 are not equalized.

Figure 6:
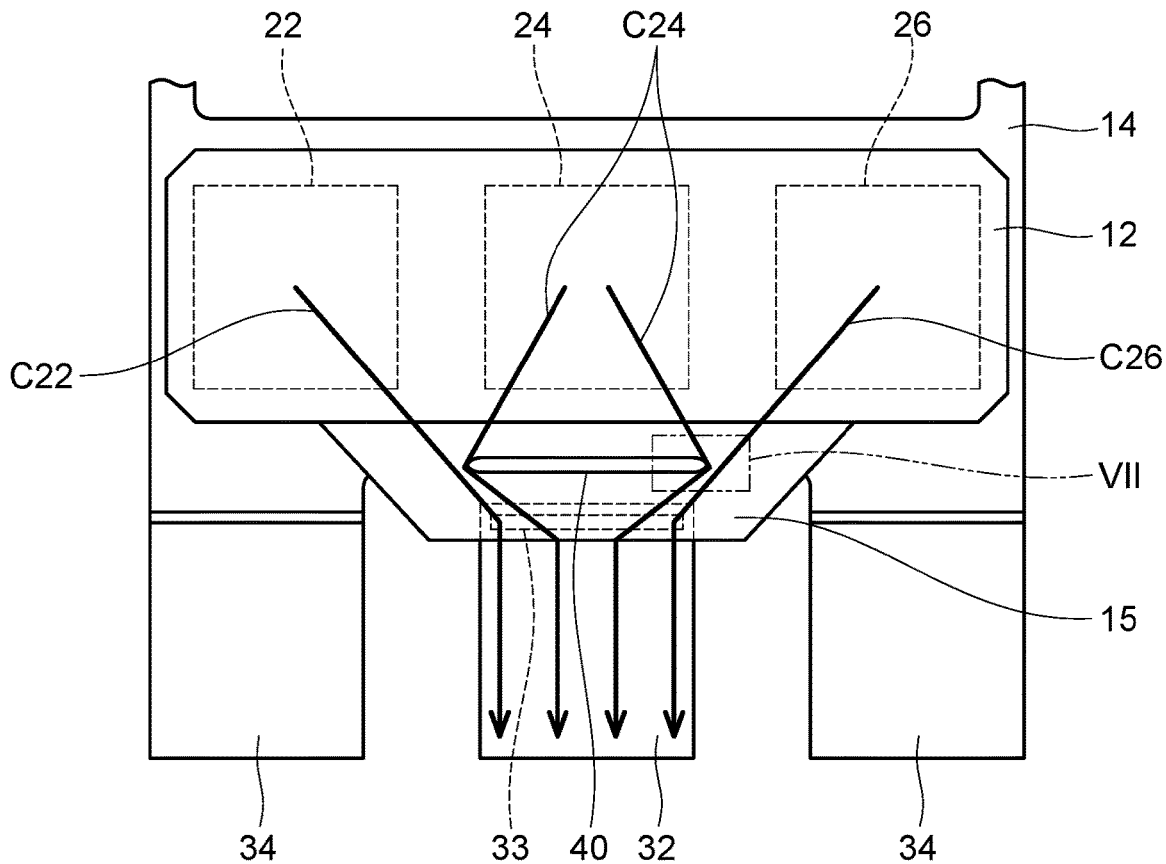
FIG. 6 schematically shows currents C22, C24, C26 flowing between the first external connection terminal 32 and the respective semiconductor chips 22, 24, 26.
Figure 7:
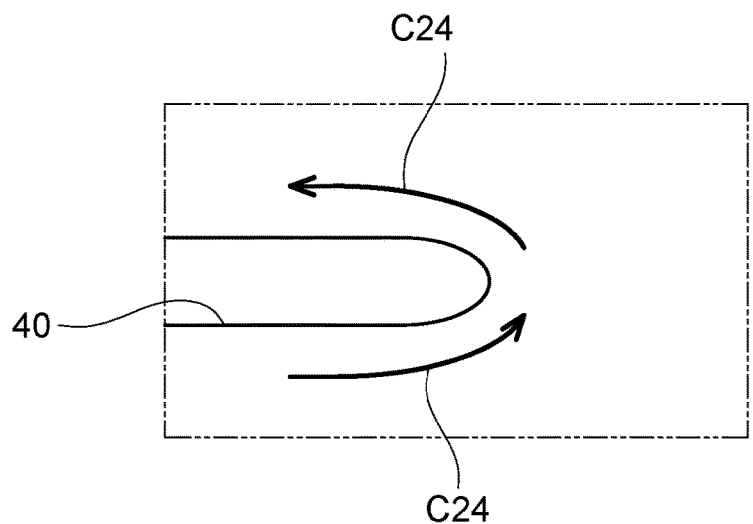
FIG. 7 schematically shows a flow of the current C24 in a vicinity of the aperture 40.

In regard to the above problem, the first conductive plate 12 of the present embodiment is provided with an aperture 40 located between the portion 33 where the first external connection terminal 32 is connected and a portion where the second semiconductor chip 24 is connected. Due to this, as shown in FIG. 6, at least a part of a current C24 flowing between the first external connection terminal 32 and the second semiconductor chip 24 needs to flow by skirting around the aperture 40, and the electric resistance thereof increases by a passage length through which the current actually flows becoming longer. As a result, the current flowing in the second semiconductor chip 24 is suppressed, by which an inequality among currents C22, C24, C26 flowing in the respective semiconductor chips 22, 24, 26 is resolved or reduced. In addition, as shown in FIG. 7, since the current C24 flows in opposite directions on both sides of the aperture 40, an inductance generated in the first conductive plate 12 is thereby reduced. This feature is especially advantageous in a case where the semiconductor device 10 is employed in an inverter or a converter, and the respective semiconductor chips 22, 24, 26 are switched at high frequency. The aperture 40 in the present embodiment is a penetrating aperture, however, the aperture 40 may be a bottomed aperture (that is, a recess). In this case as well, a thickness of the first conductive plate 12 is reduced at a position where the aperture 40 is located, by which the electric resistance is increased. Further, a material having a higher resistance than a material constituting the first conductive plate 12 may be disposed within the aperture 40.

A shape and a dimension of the aperture 40 are not particularly limited. The shape and the dimension of the aperture 40 may suitably be designed while verifying the currents C22, C24, C26 flowing in the respective semiconductor chips 22, 24, 26 by experiments or simulations. As shown in FIG. 5, the aperture 40 of the present embodiment has a slot shape, and a longitudinal axis of this slot shape is perpendicular to the symmetry plane PS. Further, the aperture 40 has a symmetric mouth about the symmetry plane PS, and a center of the slot shape is located on the symmetry plane PS. With the mouth shape of the aperture 40 being symmetric about the symmetry plane PS, symmetry between the first semiconductor chip 22 and the third semiconductor chip 26 can be avoided being lost by the presence of the aperture 40. The aperture 40 may be designed with a complicated shape instead of the relatively simple slot shape. Further, the first conductive plate 12 is not limited to include one aperture 40, and may include a plurality of apertures.

In general, a larger quantity of the current C24 flowing between the first external connection terminal 32 and the second semiconductor chip 24 skirts around the aperture 40 as the dimension of the aperture 40 (especially, the dimension in a direction perpendicular to the symmetry plane PS) is larger. In regard to this point, the aperture 40 of the present embodiment is configured such that all the current C24 flowing between the first external connection terminal 32 and the second semiconductor chip 24 skirts around the aperture 40. Specifically, in the direction perpendicular to the symmetry plane PS (that is, in a left-and-right direction in FIG. 5), the dimension of the aperture 40 is larger than a dimension of the second semiconductor chip 24, and is also larger than a dimension of the portion 33 where the first external connection terminal 32 is connected in the first conductive plate 12. The first external connection terminal 32 extends along the symmetry plane PS, and the portion 33 where the first external connection terminal 32 is connected in the first conductive plate 12 is also symmetry about the symmetry plane PS.

On the other hand, if the dimension of the aperture 40 is too large, the current C24 flowing between the first external connection terminal 32 and the second semiconductor chip 24 excessively skirts around due to the aperture 40. In this case, the electric resistance increases undesirably between the first external connection terminal 32 and the second semiconductor chip 24. In this regard, the dimension of the aperture 40 in the direction perpendicular to the symmetry plane PS is preferably smaller than a distance between centers of the first semiconductor chip 22 and the third semiconductor chip 26. In FIG. 5, a point 22X indicates the center of the first semiconductor chip 22, a point 24X indicates a center of the second semiconductor chip 24, and a point 26X indicates the center of the third semiconductor chip 26. The center 22X of the first semiconductor chip 22 is located on one side relative to the symmetry plane PS, the center 24X of the second semiconductor chip 24 is located on the symmetry plane PS, and the center 26X of the third semiconductor chip 26 is located on the other side relative to the symmetry plane PS.

As shown in FIG. 5, the first conductive plate 12 includes a portion 13 (hereinbelow termed an expanded portion 13) whose dimension in the direction perpendicular to the symmetry plane PS becomes larger from the portion 33 where the first external connection terminal 32 is connected toward the portion where the plurality of semiconductor chips 22, 24, 26 is connected. Further, the aperture 40 is located in the expanded portion 13. According to this configuration, a relatively large-sized aperture 40 can be provided. Further, by providing such an expanded portion 13, the current passage between the first external connection terminal 32 and the first semiconductor chip 22 and the current passage between the first external connection terminal 32 and the third semiconductor chip 26 can be shortened, by which a power loss in the semiconductor device 10 can be reduced. An entirety of the aperture 40 according to the present embodiment is provided in the expanded portion 13, however, only a part of the aperture may be provided in the expanded portion 13 in another embodiment. Here, the expanded portion 13 of the first conductive plate 12 has a smaller thickness than other portion of the first conductive plate 12 (that is, the portion where the plurality of semiconductor chips 22, 24, 26 is connected).

Specific configuration of the expanded portion 13 is not particularly limited. Although this is merely an example, the expanded portion 13 according to the present embodiment includes a pair of side edges 13a. Each of the side edges 13a extends from its base end 13b located close to the plurality of semiconductor chip 22, 24, 26 to its distal end 13c located close to the first external connection terminal 32. As shown in FIG. 5, when seen in a plan view along a direction perpendicular to the first conductive plate 12 and the second conductive plate 14, the base ends 13b of the side edges 13a of the expanded portion 13 are located on an outer side (that is, located farther apart from the first external connection terminal 32) than inner side edges 34a of the second external connection terminals 34 (that is, the side edges 34a located closer to the first external connection terminal 32). Further, distal ends 13c of the side edges 13a of the expanded portion 13 are located on an inner side (that is, located closer to the first external connection terminal 32) than the inner side edges 34a of the second external connection terminal 34, and are each located between the first external connection terminal 32 and its corresponding second external connection terminal 34.

According to the aforementioned configuration, the current passages between the first external connection terminal 32 and each of the first semiconductor chip 22 and the third semiconductor chip 26 are shortened, while insulation between the expanded portion 13 and the second external connection terminals 34 is increased. Especially, the second external connection terminals 34 are each provided with a bent portion 34b that is displaced upward (that is, to an expanded portion 13 side) toward a distal end side thereof (see FIGS. 4 and 5), by which the first external connection terminal 32 and the two second external connection terminals 34 are located on a same plane at least at their portions protruding from the encapsulant 16. Thus, if the distal ends 13c of the side edges 13a of the expanded portion 13 are located on the outer side than the inner side edges 34a of the second external connection terminals 34, the insulation therebetween might become insufficient by the expanded portion 13 and the second external connection terminals 34 bent toward the expanded portion 13 becoming close to each other. Contrary to this, when the distal ends 13c of the side edges 13a of the expanded portion 13 are located on the inner side than the inner side edges 34a of the second external connection terminals 34, distances between the expanded portion 13 and each of the second external connection terminals 34 can be increased, and the insulation therebetween can be increased.

The thickness of the first conductive plate 12 at the expanded portion 13 is smaller than the thickness of the first conductive plate 12 at the portion where the plurality of semiconductor chips 22, 24, 26 is connected. Due to this, the expanded portion 13 of the first conductive plate 12 is covered by the encapsulant 16, and thus does not expose on the surface of the encapsulant 16. With the expanded portion 13 of the first conductive plate 12 covered by the encapsulant 16, creeping distances along the surface of the encapsulant 16 between the expanded portion 13 of the first conductive plate 12 and the second external connection terminals 34 connected to the second conductive plate 14 can be increased, by which the insulation can be increased.

Figure 13:
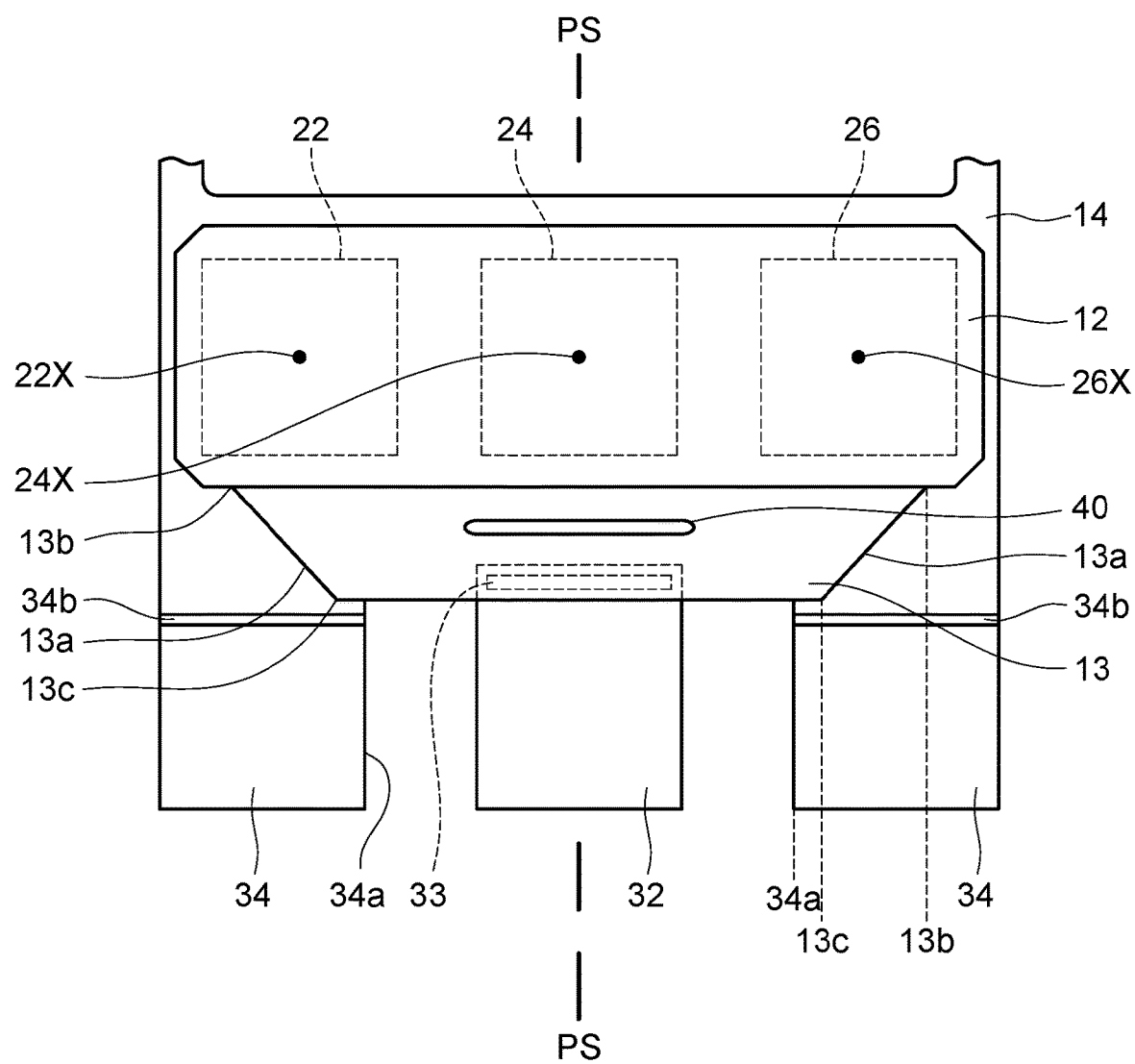
FIG. 13 shows a variant in which an expanded portion 13 of the first conductive plate 12 is enlarged.

As shown in FIG. 5, at least a part of the expanded portion 13 is opposed to each of the second external connection terminals 34. A current flows in the expanded portion 13 connected to the first external connection terminal 32 in an opposite direction from that of the second external connection terminals 34. Thus, when at least a part of the expanded portion 13 is opposed to each of the second external connection terminals 34, magnetic fields generated by electric conduction cancel out each other, by which the inductance in the current passages can be reduced. In regard to this point, the effect of reducing the inductance becomes higher when areas by which the expanded portion 13 and the second external connection terminals 34 are opposed to each other are larger. Due to this, as shown in FIG. 13, the expanded portion 13 connected to the first external connection terminal 32 may further be expanded. Due to this, the areas by which the expanded portion 13 and the second external connection terminals 34 are opposed to each other can be made larger. Although this is merely an example, in a variant shown in FIG. 13, entireties of the side edges 13a of the expanded portion 13 are located above the second external connection terminals 34 from the base ends 13b to the distal ends 13c.

In the present embodiment, the first semiconductor chip 22, the second semiconductor chip 24, and the third semiconductor chip 26 are arranged along a straight line perpendicular to the symmetry plane PS. According to this configuration, since the arrangement of these semiconductor chips 22, 24, 26 is simple, the aperture 40 can also be configured to be simple for example, and suitable design and formation of the aperture 40 can easily be conducted. However, the arrangement of the first semiconductor chip 22, the second semiconductor chip 24, and the third semiconductor chip 26 may suitably be changed. For example, the arrangement of the first semiconductor chip 22, the second semiconductor chip 24, and the third semiconductor chip 26 may be in a V shape or an inverse V shape that is symmetric about the symmetry plane PS. Further, the arrangement of the first semiconductor chip 22, the second semiconductor chip 24, and the third semiconductor chip 26 may not necessarily be in a perfect symmetry, and a certain tolerance is allowed to the arrangement. As such a tolerance, for example, a tolerance equal to or less than a half or ¼ of a size of the semiconductor chips 22, 24, 26 (so-called chip size) may be assumed.

In the semiconductor device 10 of the present embodiment, the two second external connection terminals 34 are connected to the second conductive plate 14, and the two second external connection terminals 34 are provided to be symmetric about the symmetry plane PS. As such, when the two or more second external connection terminals 34 are provided to be symmetric about the symmetry plane PS, the electric resistances of the second conductive plate 14 with respect to the respective semiconductor chips 22, 24, 26 can be equalized. The two second external connection terminals 34 may not necessarily be arranged in a perfect symmetry about the symmetry plane PS. However, one of the two second external connection terminals 34 is preferably connected to the second conductive plate 14 on one side relative to the symmetry plane PS, and the other of the two second external connection terminals 34 is preferably connected to the second conductive plate 14 on the other side relative to the symmetry plane PS. The second conductive plate 14 may employ the structure having the aperture 40, similarly to the first conductive plate 12, and in this case, a number of the second external connection terminal 34 may be one.

Regardless of the addition of an aperture to the second conductive plate 14, the number of the second external connection terminal 34 may be one. In this case, although this is merely an example, one of the two second external connection terminals 34 in the present embodiment may simply be omitted. There is no particular limitation as to which one of the two second external connection terminals 34 is to be omitted. Regardless of which one of the second external connection terminals 34 is omitted, the arrangement of the first external connection terminal 32 and the second external connection terminal 34 becomes same when front and rear of the semiconductor device 10 are inverted. However, when two or more second external connection terminals 34 are connected to the second conductive plate 14, the semiconductor device 10 can stably be supported by the two or more second external connection terminals 34 when the semiconductor device 10 is incorporated into a power conversion circuit or the like. Further, upon manufacturing the semiconductor device 10 as well, the second conductive plate 14 can stably be supported by the two or more second external connection terminals 34.

Figure 8:
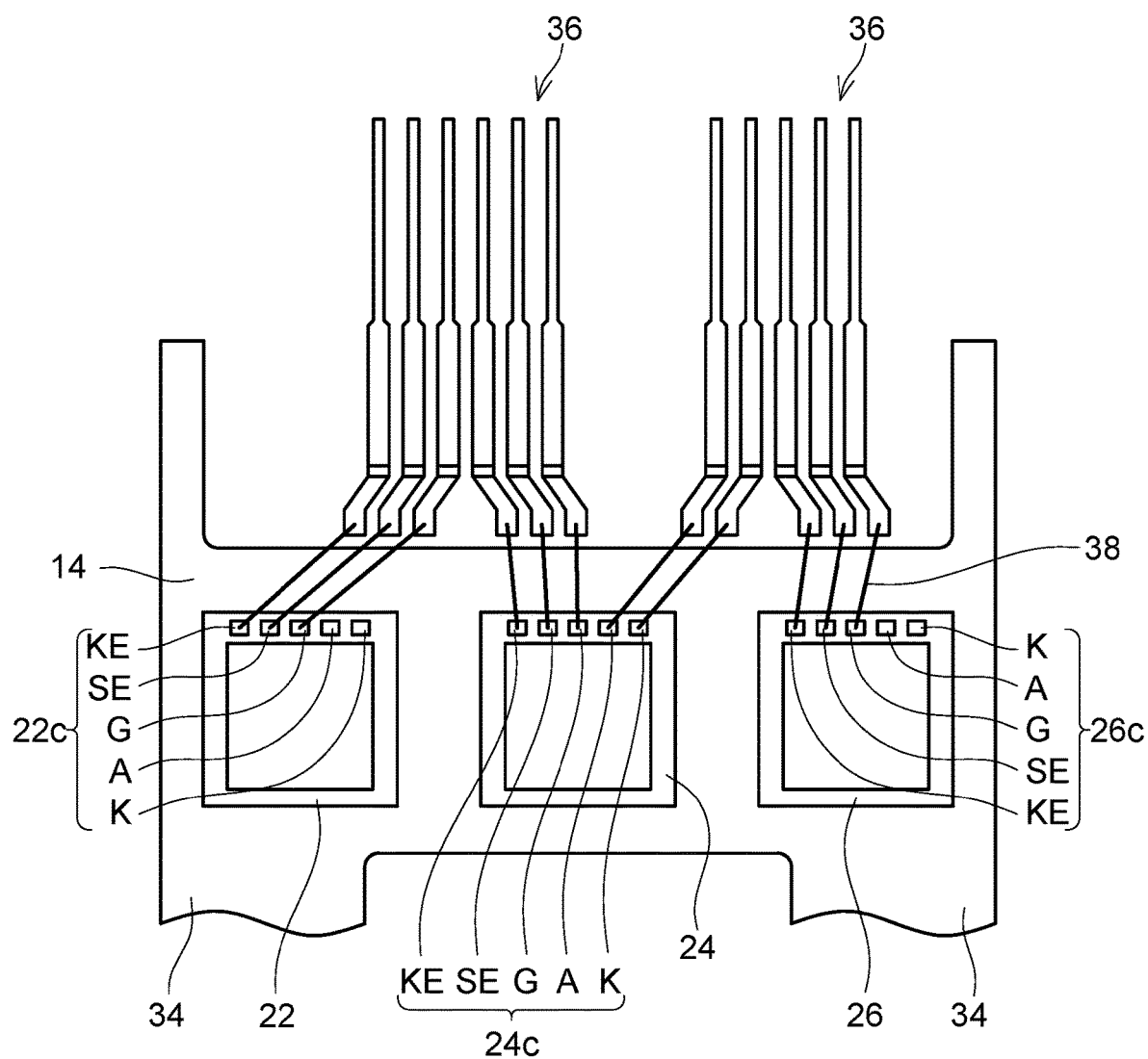
FIG. 8 shows a connection relationship between a plurality of signal pads 22c, 24c, 26c and a plurality of third external connection terminals 36.

Next, a configuration regarding the plurality of third external connection terminals 36 will be described with reference to FIG. 8. As aforementioned, the plurality of third external connection terminals 36 is connected to the signal pads 22c, 24c, 26c of the plurality of semiconductor chips 22, 24, 26. Here, in the present embodiment, the semiconductor chips 22, 24, 26 respectively include five signal pads 22c, 24c, 26c. The five signal pads 22c of the first semiconductor chip 22 include a first temperature sensing pad K, a second temperature sensing pad A, a gate driving pad CG a current sensing pad SE, and a Kelvin emitter pad KE. The first temperature sensing pad K and the second temperature sensing pad A are connected to a temperature sensor (for example, a diode) in the first semiconductor chip 22. The gate driving pad G is connected to a gate of the IGBT structure in the first semiconductor chip 22. The current sensing pad SE is configured to output a fine current proportional to the current flowing in the first semiconductor chip 22. Further, the Kelvin emitter pad KE is connected to the emitter of the IGBT structure in the first semiconductor chip 22. Similarly, the five signal pads 24c of the second semiconductor chip 24 and the five signal pads 26c of the third semiconductor chip 26 also include first temperature sensing pads K, second temperature sensing pads A, gate driving pads G, current sensing pads SE, and Kelvin emitter pads KE.

As can be understood from the above, a total of fifteen signal pads 22c, 24c, 26c are present in the semiconductor device 10 of the present embodiment. Contrary to this, the number of the plurality of third external connection terminals 36 is eleven, which is less than the number of the signal pads 22c, 24c, 26c. This is because the plurality of third external connection terminals 36 is not connected to the first temperature sensing pad K and the second temperature sensing pad A of the first semiconductor chip 22 and the first temperature sensing pad K and the second temperature sensing pad A of the third semiconductor chip 26. In the semiconductor device 10, the second semiconductor chip 24 located at a center tends to have a high temperature than the first semiconductor chip 22 and the third semiconductor chip 26 located on both sides. Due to this, overheating of the first semiconductor chip 22 and the third semiconductor chip 26 can be avoided by simply monitoring a temperature of the second semiconductor chip 24. Based on this viewpoint, the semiconductor device 10 omits connection of the third external connection terminals 36 to the first temperature sensing pad K and the second temperature sensing pad A of the first semiconductor chip 22 and the first temperature sensing pad K and the second temperature sensing pad A of the third semiconductor chip 26. Due to this, the number of the plurality of third external connection terminals 36 is reduced. By this reduction in the number of the plurality of third external connection terminals 36, for example, a number of external connectors to be connected to the plurality of third external connection terminals 36 can be reduced. Although this is merely an example, it is assumed that the eleven third external connection terminals 36 are connected to two external connectors in the semiconductor device 10 of the present embodiment, so the third external connection terminals 36 are arranged to be divided into a group of five and a group of six.

Figure 9:
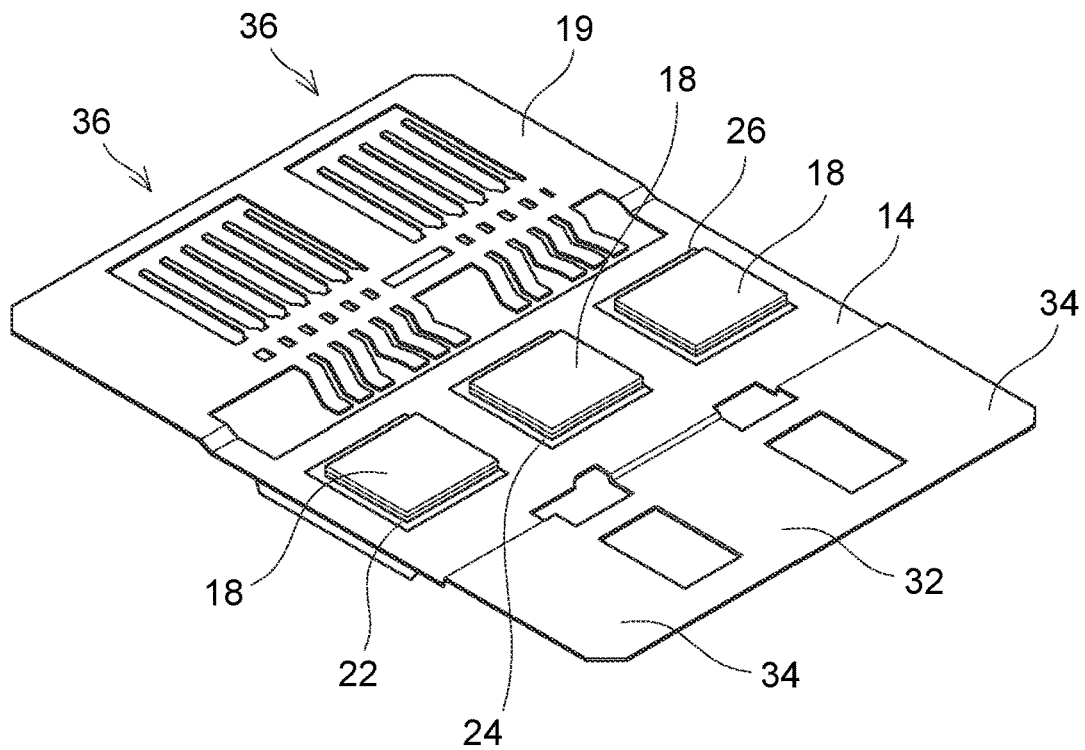
FIG. 9 is a diagram explaining a process of a method of manufacturing the semiconductor device 10, and shows a semi-finished product in which the plurality of semiconductor chips 22, 24, 26 and a plurality of conductor spacers 18 are soldered to a lead frame 19.

Next, an example of a method of manufacturing the semiconductor device 10 will be described with reference to FIGS. 9 to 12. Firstly, as shown in FIG. 9, a first reflow process is executed. In this process, the plurality of semiconductor chips 22, 24, 26, the plurality of conductor spacers 18, and the lead frame 19 are prepared. The lead frame 19 has the second conductive plate 14, the first external connection terminal 32, the two second external connection terminals 34, and the plurality of third external connection terminals 36 integrated thereon. Next, the plurality of semiconductor chips 22, 24, 26 and the plurality of conductor spacers 18 are soldered to the second conductive plate 14 of the lead frame 19. At this occasion, the plurality of semiconductor chips 22, 24, 26 is soldered on the second conductive plate 14, and one conductor spacer 18 is soldered to each of the semiconductor chips 22, 24, 26.

Figure 10:
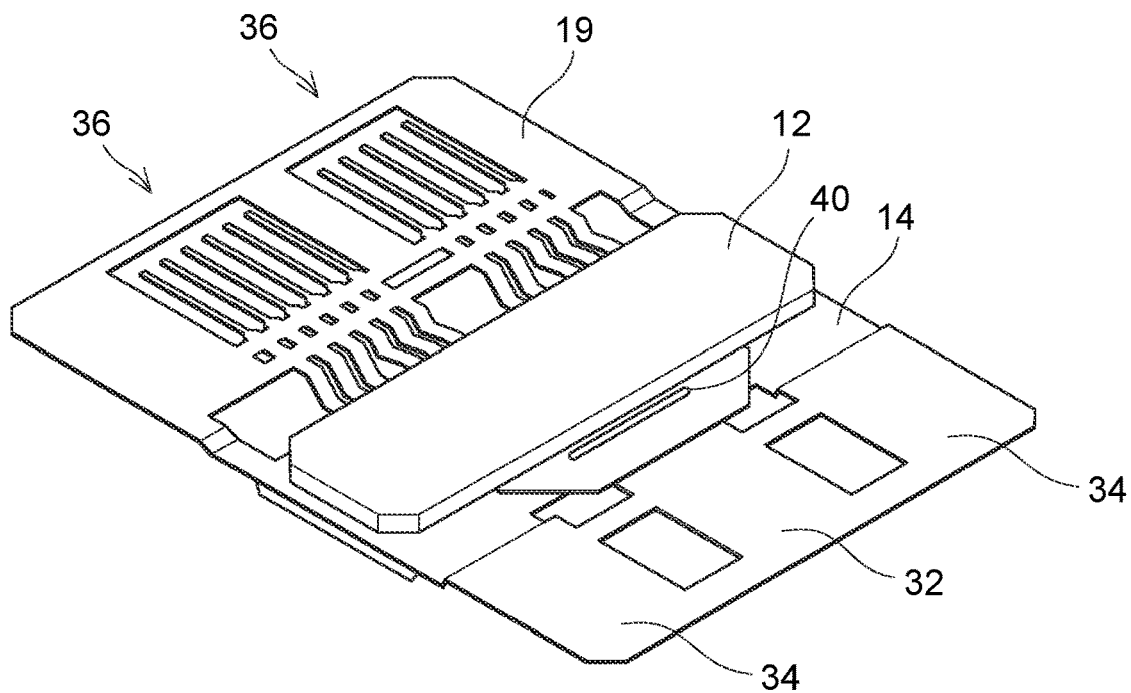
FIG. 10 is a diagram explaining a process of the method of manufacturing the semiconductor device 10, and shows the semi-finished product in which the first conductive plate 12 is soldered on the plurality of conductor spacers 18.
Figure 11:
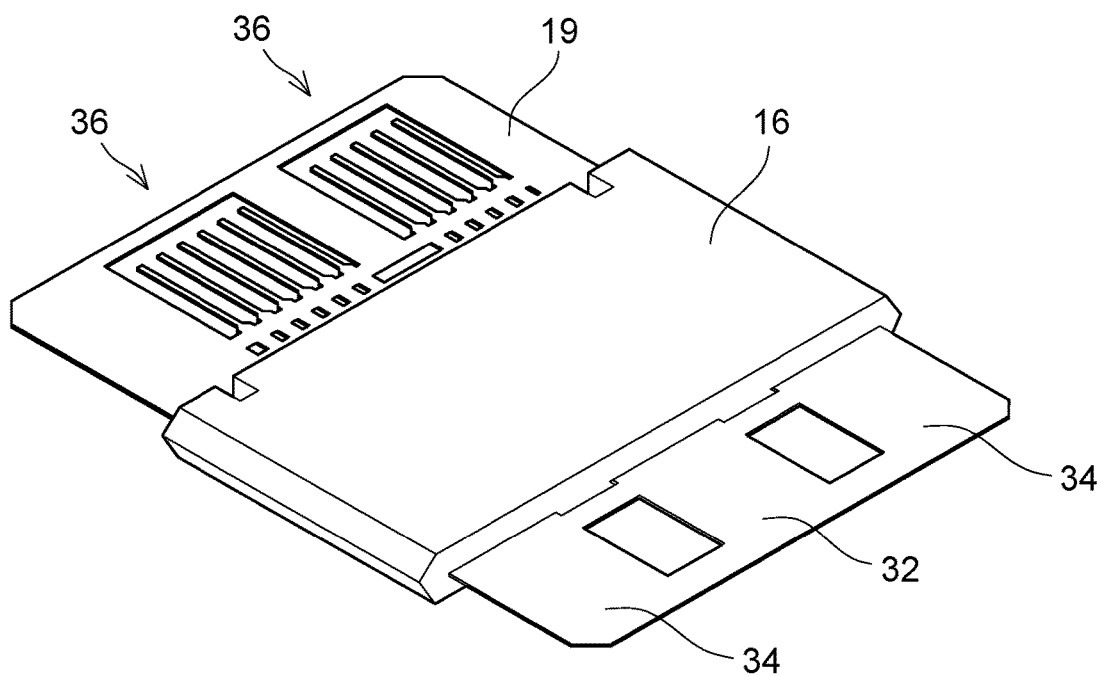
FIG. 11 is a diagram explaining a process of the method of manufacturing the semiconductor device 10, and shows the semi-finished product in which an encapsulant 16 is formed.
Figure 12:
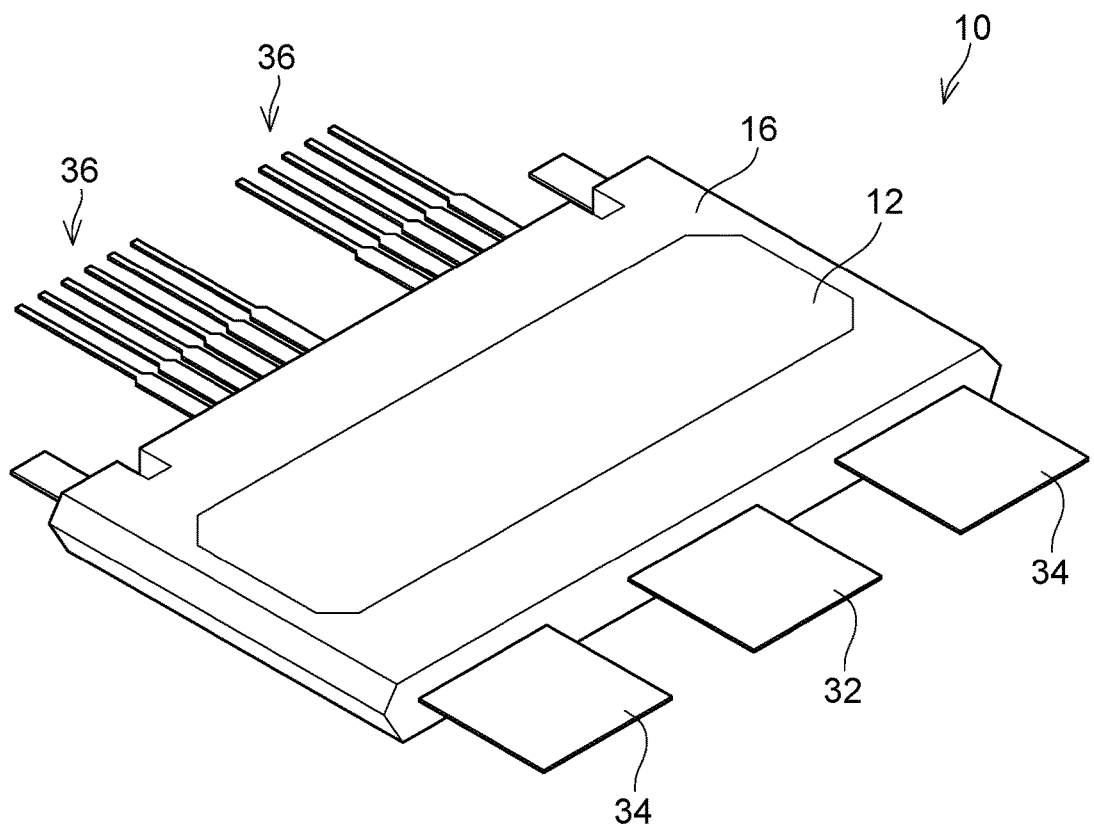
FIG. 12 is a diagram explaining a process of the method of manufacturing the semiconductor device 10, and shows a completed semiconductor device 10.

Next, as shown in FIG. 10, a second reflow process is executed. In this process, the first conductive plate 12 is prepared, and the first conductive plate 12 is soldered on the plurality of conductor spacers 18. Then, as shown in FIG. 11, an encapsulating process is executed. In this process, the encapsulant 16 is formed by encapsulating the plurality of semiconductor chips 22, 24, 26 with sealing resin, for example. At this stage, the first conductive plate 12 and the second conductive plate 14 may be covered by the encapsulant 16. Further, prior to the encapsulating process, a process to apply primer on the lead frame 19 may be executed. Finally, as shown in FIG. 12, unnecessary portions of the lead frame 19 are removed, and the surfaces of the encapsulant 16 are cut or ground to expose the first conductive plate 12 and the second conductive plate 14 on the surfaces of the encapsulant 16. Due to this, the semiconductor device 10 is completed.

As above, the technique disclosed herein improves the inequality of the electric resistances between the first external connection terminal 32 connected to the first conductive plate 12 and the respective semiconductor chips 22, 24, 26 by providing the aperture 40 in the first conductive plate 12. This technique using the aperture 40 can similarly be employed in the second conductive plate 14. Alternatively, even in a case where the semiconductor device 10 is not provided with the second conductive plate 14, the technique can similarly be employed. In addition, as another configurational example, a slit may be provided in the first conductive plate 12 and/or the second conductive plate 14 instead of the aperture 40. In these cases as well, the passage lengths of the currents C22, C24, C26 can be equalized for the plurality of semiconductor chips 22, 24, 26. Alternatively, cross sectional areas of the passages through which the currents C22, C24, C26 of the respective semiconductor chips 22, 24, 26 flow may be changed according to the distances between the first external connection terminal 32 and the respective semiconductor chips 22, 24, 26. According to this configuration as well, the inequality of the electric resistances between the first external connection terminal 32 and the respective semiconductor chips 22, 24, 26 can be improved.

In the aforementioned embodiment, the semiconductor device 10 includes the two second external connection terminals 34, however, the number of the second external connection terminals 34 is not particularly limited. As aforementioned, the semiconductor device 10 may include only a single second external connection terminal 34, or may include three or more second external connection terminals 34. Further, each second external connection terminal 34 may be located on a same side as the side of the first external connection terminal 32 with respect to the encapsulant 16, or may be located on a side different from the side of the first external connection terminal 32.

Figure 14:
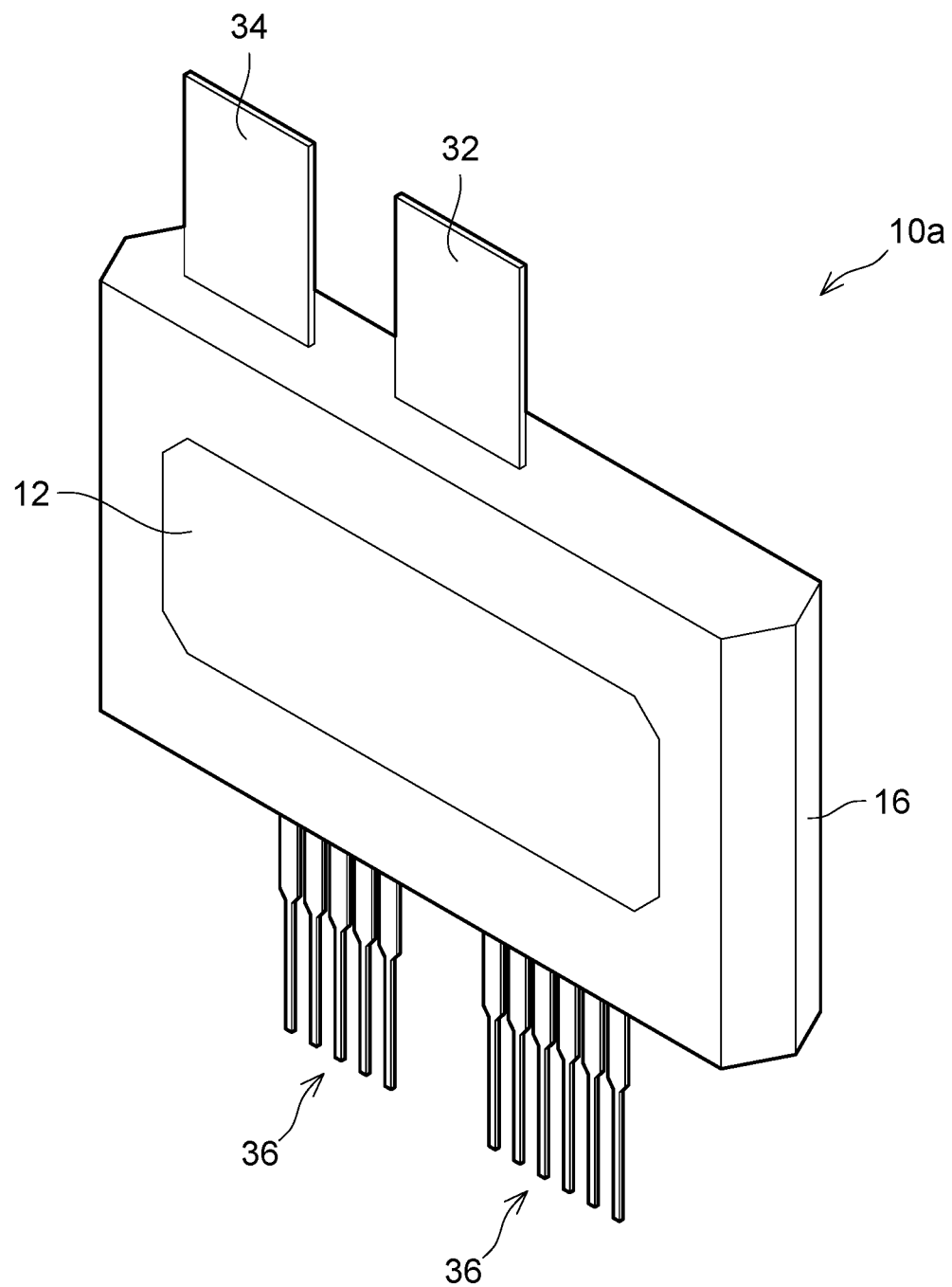
FIG. 14 shows a semiconductor device 10a including a single second external connection terminal 34.
Figure 15:
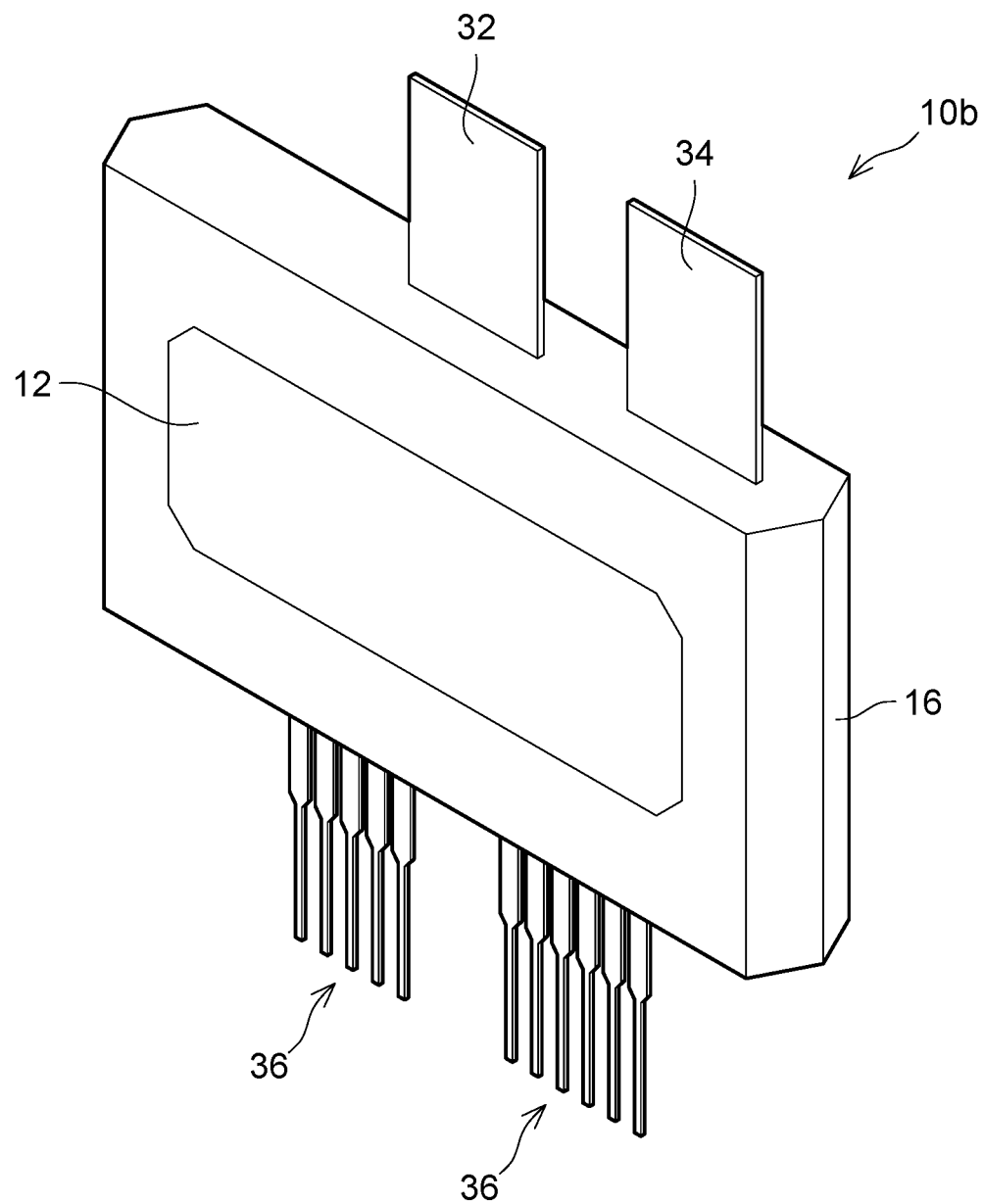
FIG. 15 shows another semiconductor device 10b including the single second external connection terminal 34.

FIGS. 14 and 15 respectively show semiconductor devices 10a, 10b each including a single second external connection terminal 34. In the semiconductor device 10a shown in FIG. 14, one second external connection terminal 34 of the two second external connection terminals 34 of the aforementioned semiconductor device 10 is omitted. In the semiconductor device 10b shown in FIG. 15, the other second external connection terminal 34 of the two second external connection terminals 34 of the aforementioned semiconductor device 10 is omitted.

Figure 16:
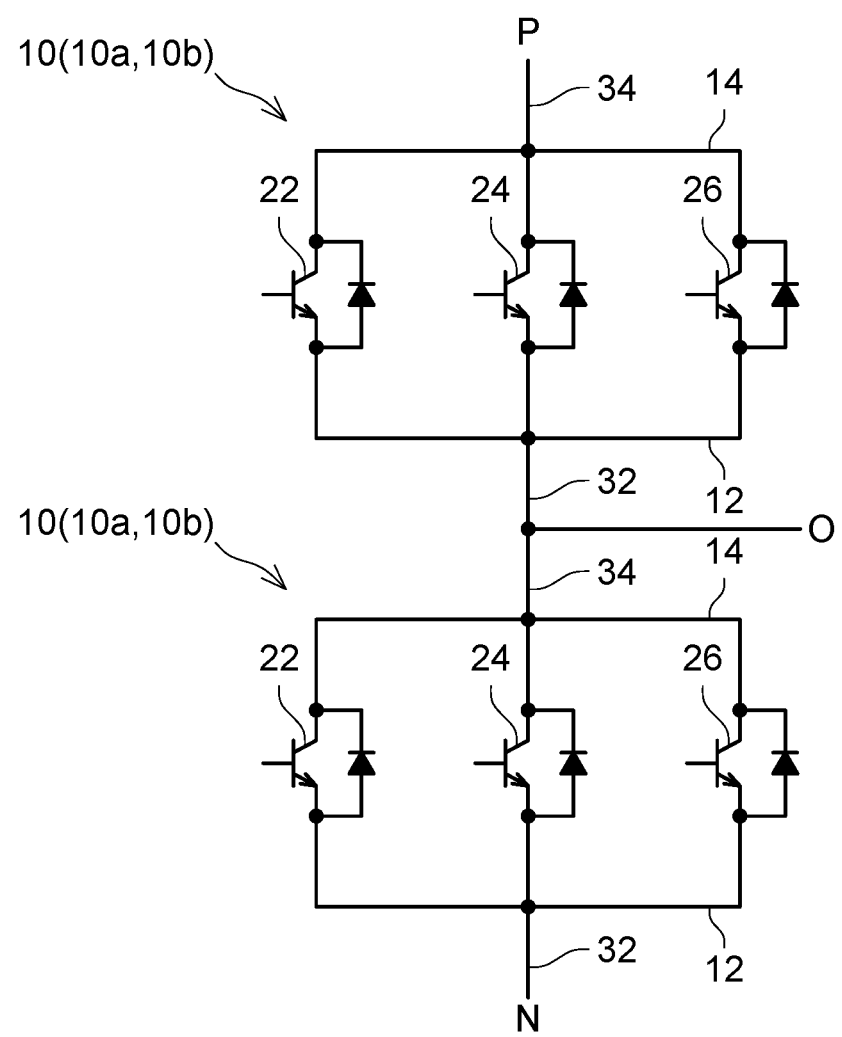
FIG. 16 shows a circuit structure for a case where two semiconductor devices 10 (10a, 10b) are connected in series.
Figure 17:
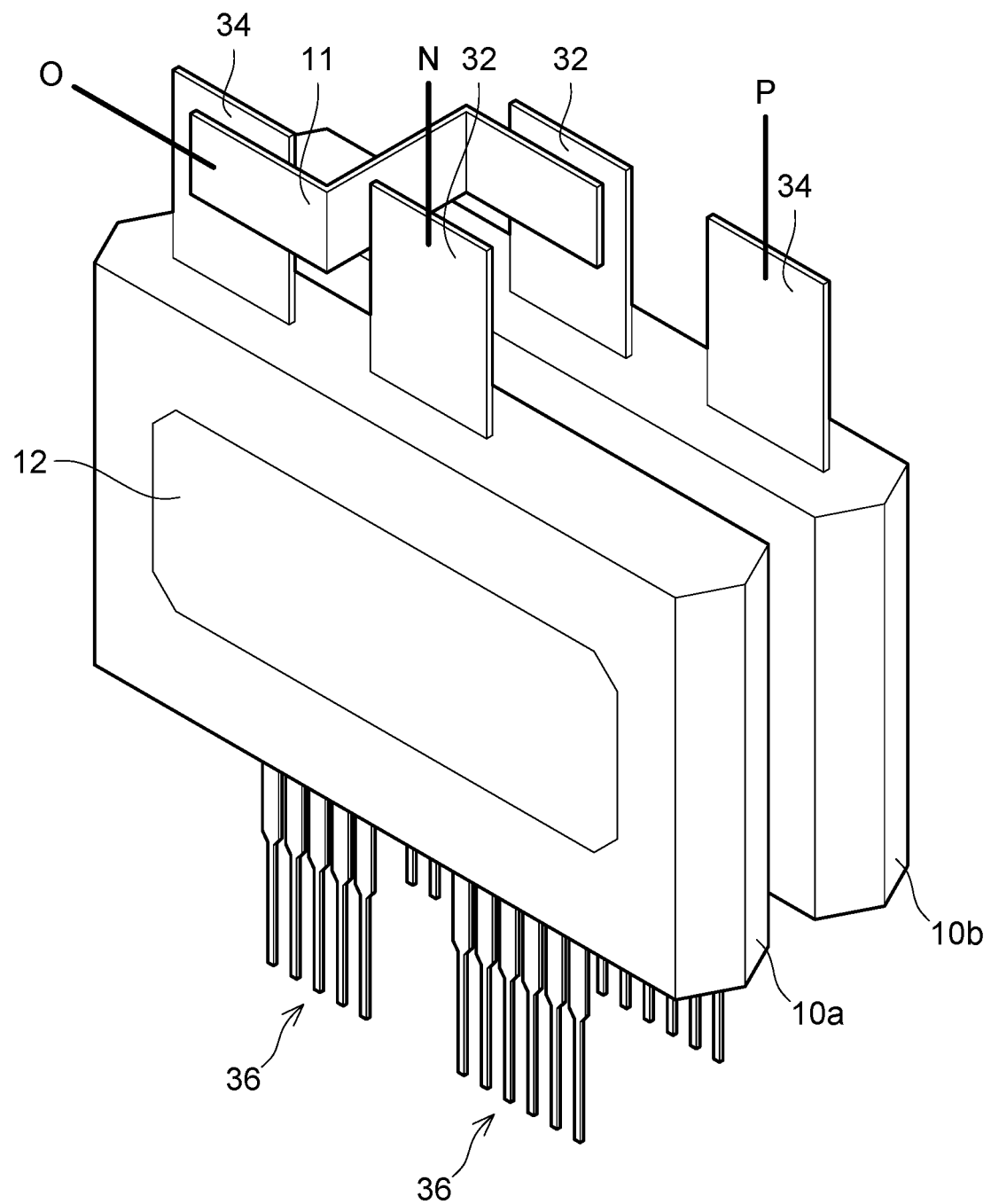
FIG. 17 shows an embodiment in which the semiconductor device 10a shown in FIG. 14 and the semiconductor device 10b shown in FIG. 15 are connected in series.

As aforementioned, the semiconductor devices 10, 10a, 10b disclosed herein may be employed in a power converter circuit such as a converter or an inverter. In this case, as shown in FIG. 16, two semiconductor devices 10, 10a, 10b may be connected in series to constitute upper and lower arms of the converter or the inverter. Any of the three types of semiconductor devices 10, 10a, 10b may be employed as each of the two semiconductor devices 10, 10a, 10b.

FIGS. 17 to 20 show several embodiments in which two semiconductor devices 10, 10a, 10b connected in series. In the embodiment shown in FIG. 17, the semiconductor device 10a shown in FIG. 14 and the semiconductor device 10b shown in FIG. 15 are connected in series. The two semiconductor devices 10a, 10b are disposed to oppose each other, and although not shown in FIG. 17, the second conductive plate 14 of the one (frontside) semiconductor device 10a and the first conductive plate 12 of the other (rearside) semiconductor device 10b are opposed to each other. The second external connection terminal 34 of the one semiconductor device 10a is connected to the first external connection terminal 32 of the other semiconductor device 10b via a bus bar 11. Reference signs P, O, N in FIGS. 17 to 20 respectively correspond to reference signs P, O, N in FIG. 16.

Figure 18:
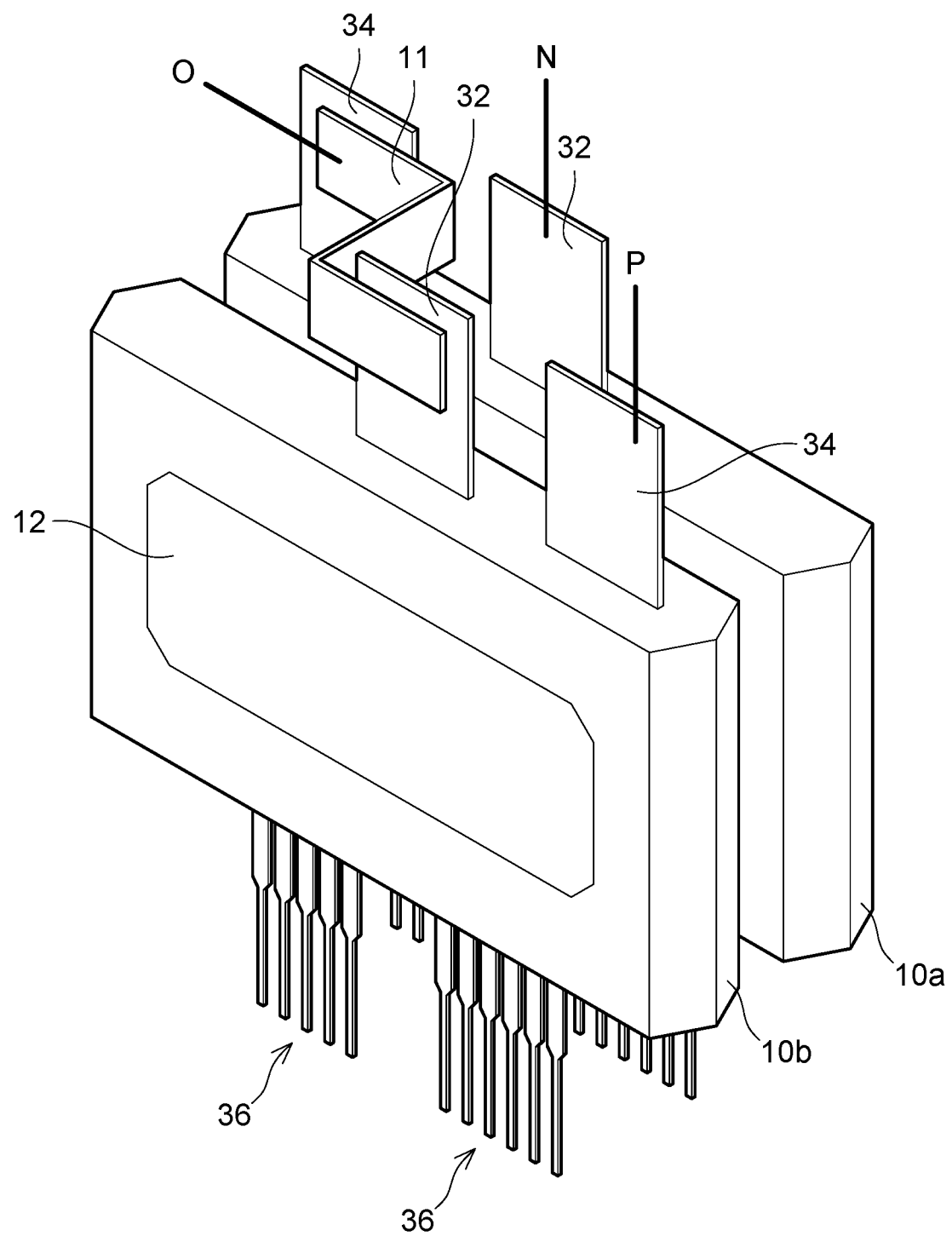
FIG. 18 shows another embodiment in which the semiconductor device 10a shown in FIG. 14 and the semiconductor device 10b shown in FIG. 15 are connected in series.

In the embodiment shown in FIG. 18 as well, the semiconductor device 10a shown in FIG. 14 and the semiconductor device 10b shown in FIG. 15 are connected in series. However, as compared to the embodiment shown in FIG. 17, locations of the two semiconductor devices 10a, 10b are switched, and although not shown in FIG. 18, the first conductive plate 12 of the one (rearside) semiconductor device 10a and the second conductive plate 14 of the other (frontside) semiconductor device 10b are opposed to each other. The second external connection terminal 34 of the one semiconductor device 10a is connected to the first external connection terminal 32 of the other semiconductor device 10b via the bus bar 11.

Figure 19:
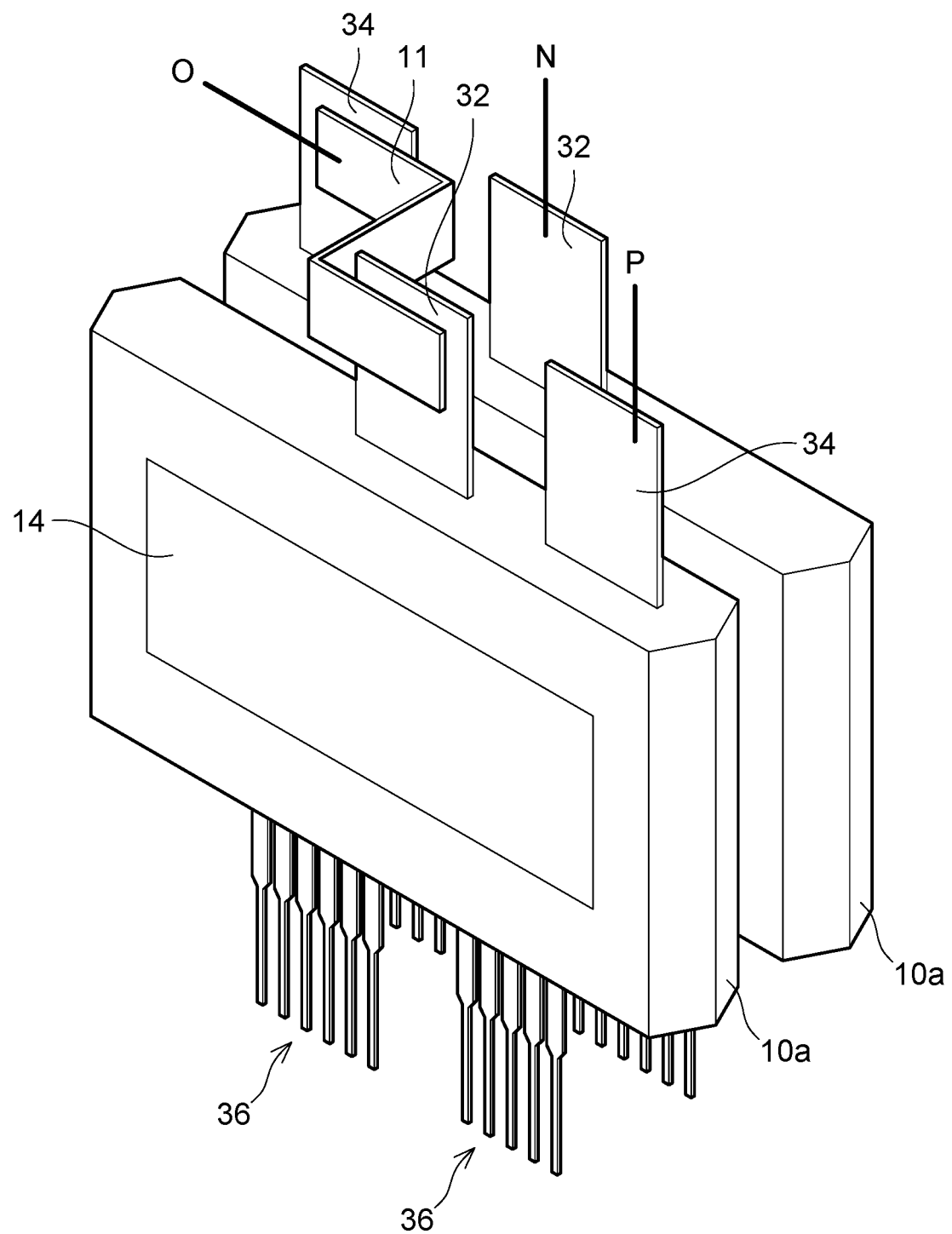
FIG. 19 shows an embodiment in which two semiconductor devices 10a shown in FIG. 14 are connected in series.

In the embodiment shown in FIG. 19, two of the semiconductor device 10a shown in FIG. 14 are connected in series. The two semiconductor devices 10a are disposed to oppose each other, and although not shown in FIG. 19, the first conductive plate 12 of the one (frontside) semiconductor device 10a and the first conductive plate 12 of the other (rearside) semiconductor device 10a are opposed to each other. That is, the two semiconductor devices 10a are in postures that are inverted from each other. The first external connection terminal 32 of the one semiconductor device 10a is connected to the second external connection terminal 34 of the other semiconductor device 10a via the bus bar 11.

Figure 20:
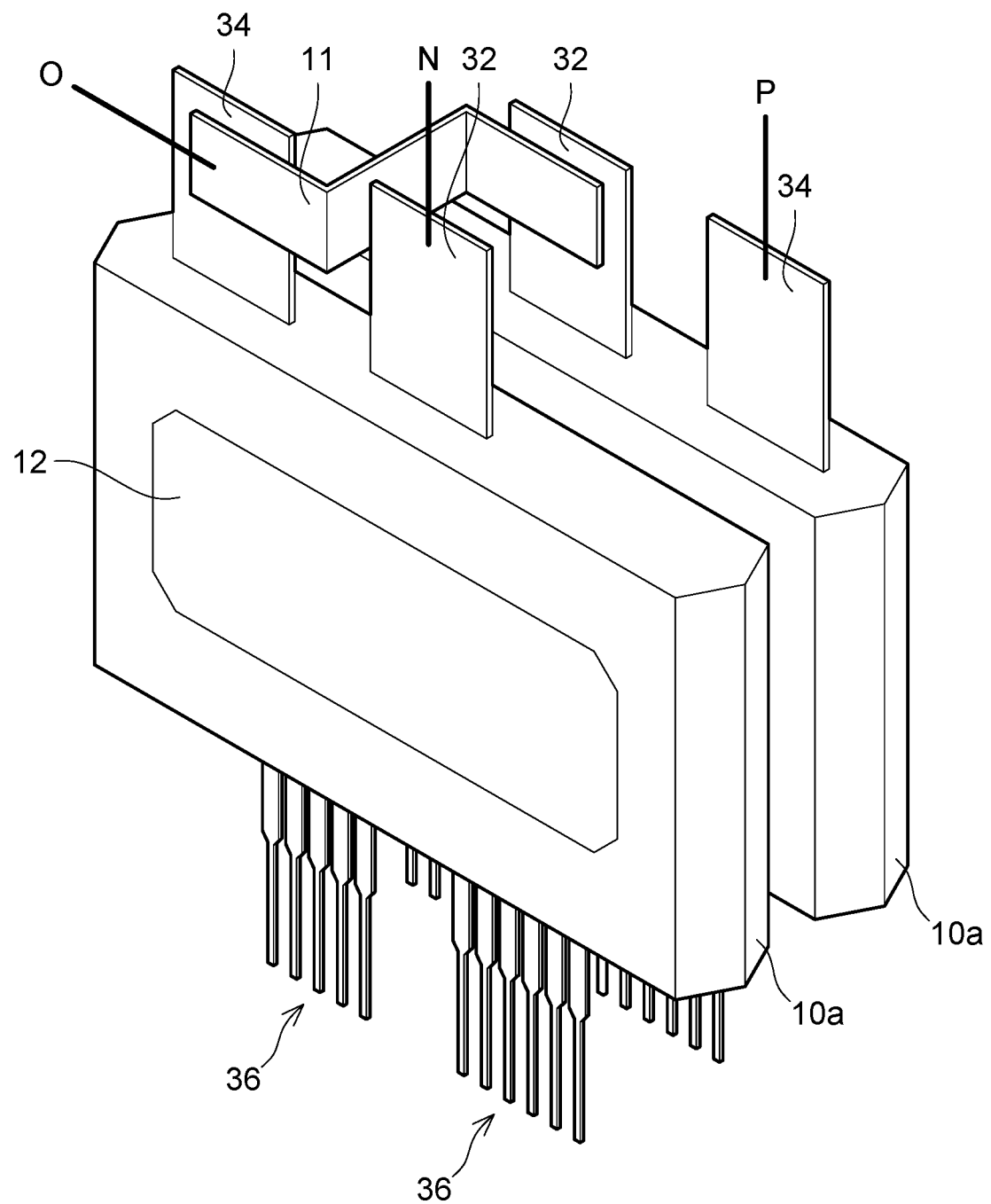
FIG. 20 shows another embodiment in which the two semiconductor devices 10a shown in FIG. 14 are connected in series.
Figure 21:
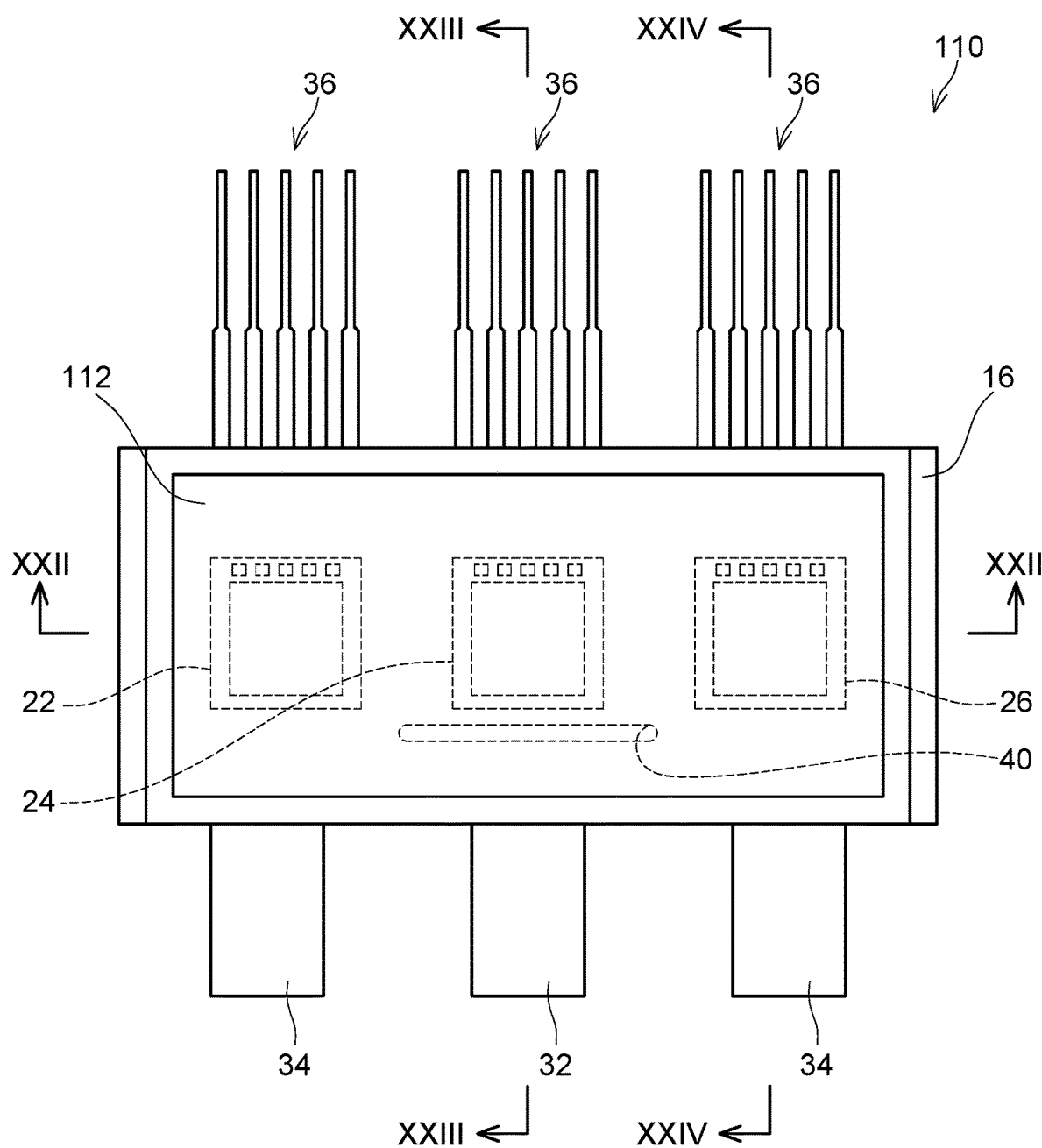
FIG. 21 is a plan view showing a semiconductor device 110 of a second embodiment.
Figure 22:
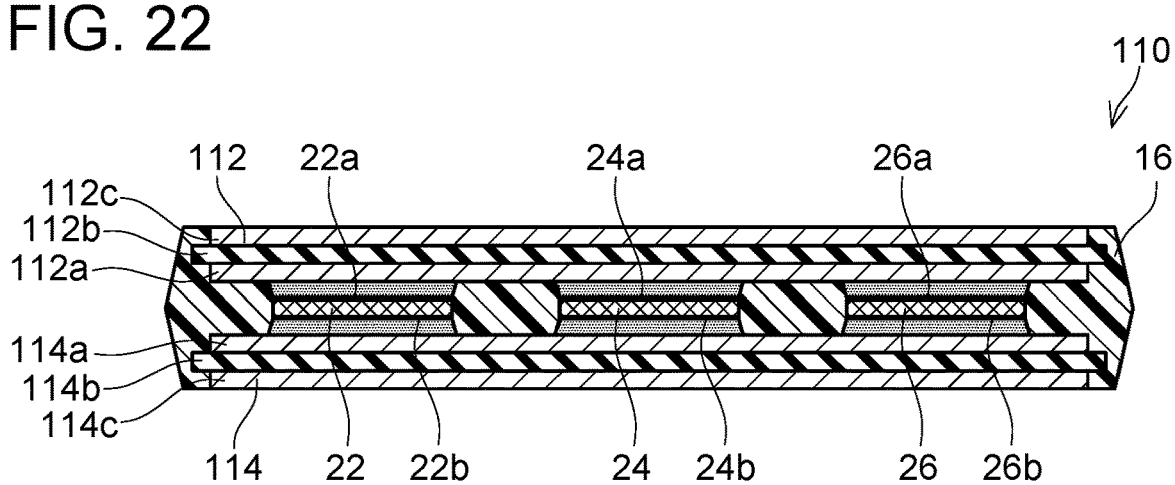
FIG. 22 is a cross-sectional view along a line XXII-XXII in FIG. 21.
Figure 23:
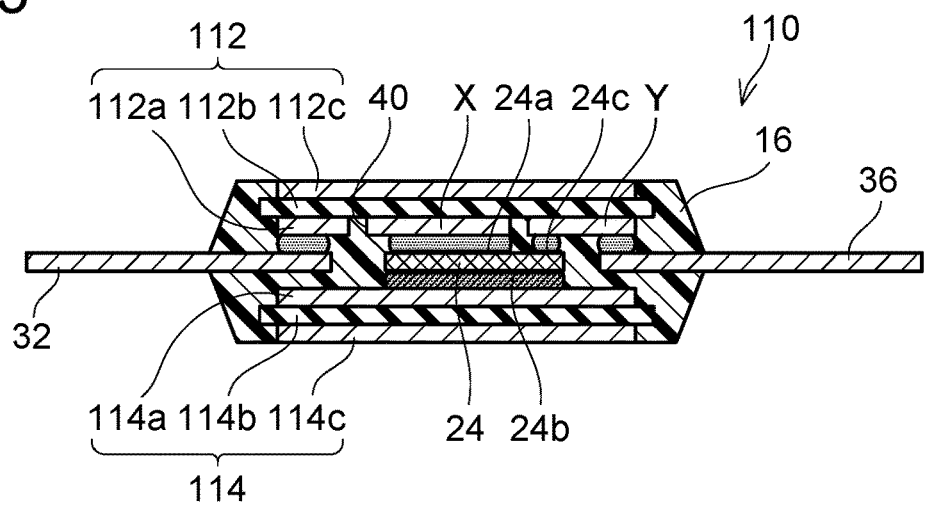
FIG. 23 is a cross-sectional view along a line XXIII-XXIII in FIG. 21.
Figure 24:
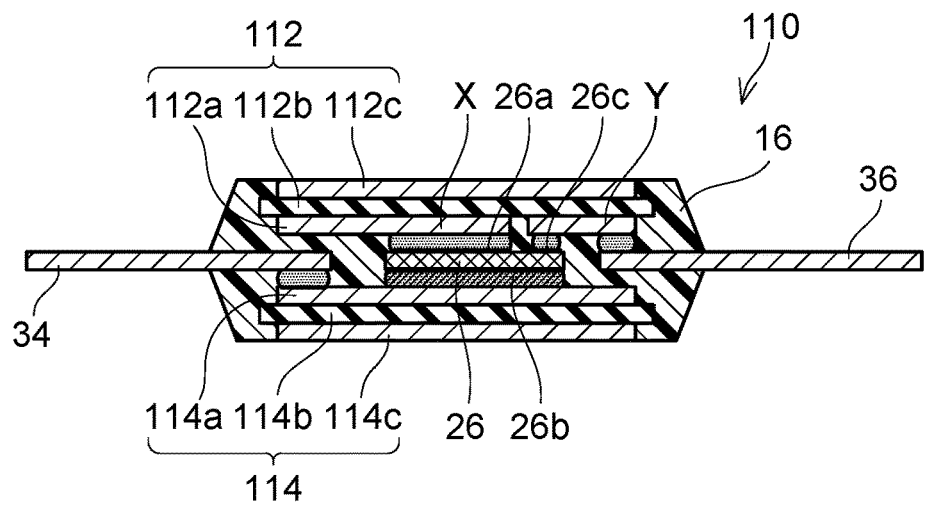
FIG. 24 is a cross-sectional view along a line XXIV-XXIV in FIG. 21.
Figure 25:
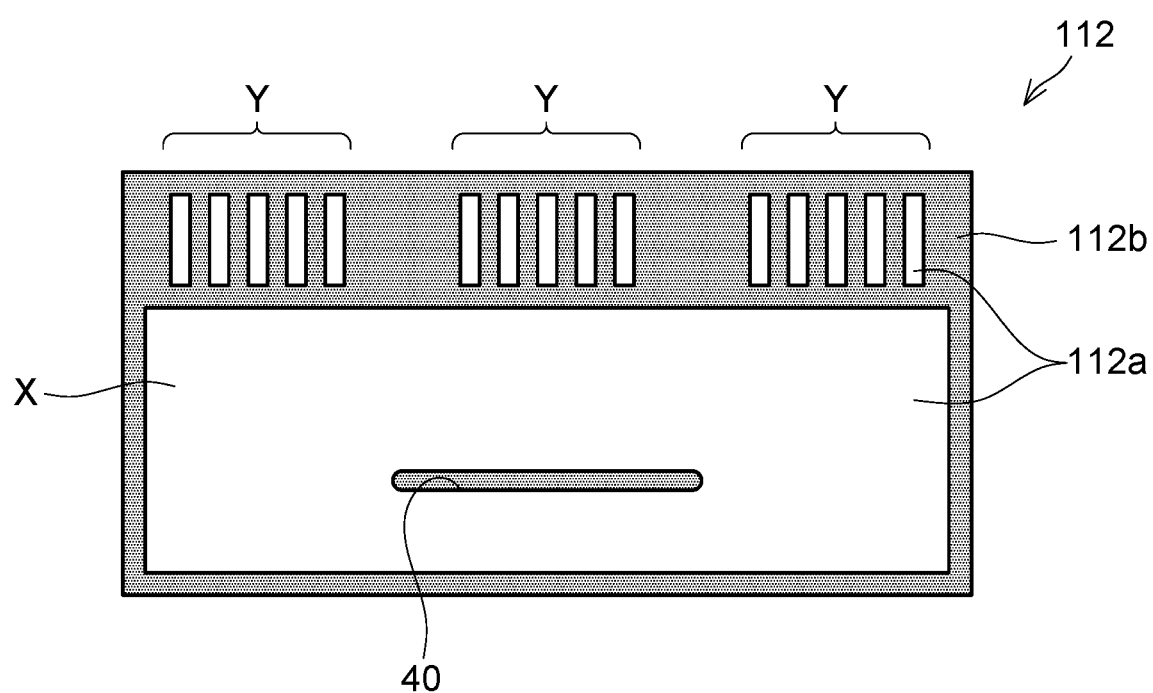
FIG. 25 is a plan view showing an inner conductor layer 112a of a first conductive plate 112 (insulated substrate).

In the embodiment shown in FIG. 20 as well, two of the semiconductor device 10a shown in FIG. 14 are connected in series. However, as compared to the embodiment shown in FIG. 19, orientations of the respective semiconductor devices 10a are inverted, and although not shown in FIG. 20, the second conductive plate 14 of the one semiconductor device 10a and the second conductive plate 14 of the other semiconductor device 10a are opposed to each other. The first external connection terminal 32 of the one semiconductor device 10a is connected to the second external connection terminal 34 of the other semiconductor device 10a via the bus bar 11. Embodiments in which two or more of the semiconductor devices 10, 10a, 10b are connected are not limited to the embodiments shown in FIGS. 17 to 20.

According to the technique disclosed herein, the semiconductor device may include the first conductive plate, the plurality of semiconductor chips disposed on the first conductive plate, and the first external connection terminal connected to the first conductive plate. In this case, the plurality of semiconductor chips may include the first semiconductor chip, the second semiconductor chip, and the third semiconductor chip. Further, the first conductive plate may be provided with at least one aperture, by which the currents that flow respectively in the first semiconductor chip, the second semiconductor chip, and the third semiconductor chip can be equalized. Equalization described herein means to reduce differences among the currents as compared to a case where no aperture is present.

Next, a semiconductor device 110 of a second embodiment will be described with reference to FIGS. 21 to 25. Firstly, in this semiconductor device 110, an insulated substrate is employed for each of a first conductive plate 112 and a second conductive plate 114, and the semiconductor device 110 differs from the aforementioned semiconductor devices 10, 10a, 10b in this regard. Secondly, the number of the third external connection terminals 36 is also changed, and specifically, the number of the third external connection terminals 36 is equal to the number of the signal pads 22c, 24c, 26c of the plurality of semiconductor chips 22, 24, 26. Thirdly, the semiconductor chips 22, 24, 26 are bonded to the first conductive plate 112 without intervention of the conductor spacers 18. Other configurations are same as or corresponding to those of the aforementioned semiconductor devices 10, 10a, 10b. The configurations that are same as or corresponding to those of the aforementioned semiconductor devices 10, 10a, 10b will be given the same reference signs, and iterating explanations thereof will be omitted.

As shown in FIGS. 21 to 25, the first conductive plate 112 includes an inner conductor layer 112a, an insulator layer 112b, and an outer conductor layer 12c. The insulator layer 112b is disposed between the inner conductor layer 112a and the outer conductor layer 112c. Although this is merely an example, each of the inner conductor layer 112a and the outer conductor layer 112c may be a metal layer constituted of copper or aluminum, and the insulator layer 112b may be a ceramic substrate. DBC (Direct Bonded Copper) or DBA (Direct Bonded Aluminum) may be employed, for example, as such a first conductive plate 112.

The inner conductor layer 12a has the upper electrodes 22a, 24a, 26a of the plurality of semiconductor chips 22, 24, 26 bonded thereto inside the encapsulant 16. Further, the inner conductor layer 112a also has the first external connection terminal 32 bonded thereto. Due to this, the first external connection terminal 32 is electrically connected to the semiconductor chips 22, 24, 26 via the inner conductor layer 112a. Further, the inner conductor layer 112a is provided with the aperture 40 for equalizing the currents flowing in the respective semiconductor chips 22, 24, 26. The function of the aperture 40 is the same as that of the aforementioned semiconductor device 10. That is, the aperture 40 causes the current flowing between the second semiconductor chip 24 and the first external connection terminal 32 to skirt therearound, by which the currents flowing in the plurality of semiconductor chips 22, 24, 26 having the different distances from the first external connection terminal 32 are equalized. The specific configuration of the aperture 40 (such as its location, size, and shape) can suitably be designed, as in the aforementioned semiconductor device 10.

The inner conductor layer 112a of the first conductive plate 112 includes a main portion X and a plurality of signal line portions Y. The main portion X has the plurality of semiconductor chips 22, 24, 26 and the first external connection terminal 32 bonded thereto, and further the aperture 40 is provided therein. The plurality of signal line portions Y is provided to separate (insulated) from the main portion X, and respectively connects the plurality of signal pads 22c, 24c, 26c to the plurality of third external connection terminals 36. As above, when the first conductive plate 112 is the insulated substrate, a profile of the inner conductor layer 112a can freely be designed, and an internal structure of the semiconductor device 110 can be simplified.

The aperture 40 of the first conductive plate 112 is provided only in the inner conductor layer 112a, and includes a bottom surface defined by the insulator layer 112b. According to this configuration, rigidity of the first conductive plate 112 can be avoided being deteriorated due to the presence of the aperture 40. Further, the inner conductor layer 112a and the outer conductor layer 112c can be avoided unintentionally becoming electrically conducted. The outer conductor layer 112c is exposed at the surface of the encapsulant 16, and is disposed adjacent to a cooler disposed outside, for example.

The second conductive plate 114 includes an inner conductor layer 114a, an insulator layer 114b, and an outer conductor layer 114c. The insulator layer 114b is disposed between the inner conductor layer 114a and the outer conductor layer 114c. The inner conductor layer 114a of the second conductive plate 114 is opposed to the inner conductor layer 112a of the first conductive plate 112. Although this is merely an example, each of the inner conductor layer 114a and the outer conductor layer 114c may be a metal layer constituted of copper or aluminum, and the insulator layer 114b may be a ceramic substrate. DBC or DBA, for example, may be employed as such a second conductive plate 114.

The inner conductor layer 114a has the lower electrodes 22b, 24b, 26b of the plurality of semiconductor chips 22, 24, 26 bonded thereto inside the encapsulant 16. Further, the inner conductor layer 114a also has two second external connection terminals 34 bonded thereto. Due to this, the two second external connection terminals 34 are electrically connected to the semiconductor chips 22, 24, 26 via the inner conductor layer 114a. On the other hand, the outer conductor layer 114c is exposed at the surface of the encapsulant 16, and is disposed adjacent to a cooler disposed outside, for example.

As above, in the semiconductor device 110, the insulated substrates are employed as the first conductive plate 112 and the second conductive plate 114. According to this configuration, the inner conductor layers 112a, 114a can be fabricated with free profiles, and for example, the inner conductor layer 112a of the first conductive plate 112 and the inner conductor layer 114a of the second conductive plate 114 can oppose each other over a large area. Since currents in opposite directions flow respectively in the inner conductor layer 112a of the first conductive plate 112 and in the inner conductor layer 114a of the second conductive plate 114, an impedance of the semiconductor device 110 can significantly be reduced with those inner conductor layers 112a, 114a opposed to each other over the large area. Due to this, a surge voltage generated upon switching the semiconductor chips 22, 24, 26 can be suppressed, for example.

What is claimed is:

1. A semiconductor device comprising:
   a first conductive plate;
   a plurality of semiconductor chips disposed on the first conductive plate; and
   a first external connection terminal connected to the first conductive plate,
   wherein
   the plurality of semiconductor chips comprises a first semiconductor chip, a second semiconductor chip, and a third semiconductor chip,
   the second semiconductor chip is located between the first semiconductor chip and the third semiconductor chip,
   a portion of the first conductive plate where the first external connection terminal is connected is closest to the second semiconductor chip among the first, second, and third semiconductor chips,
   the first conductive plate comprises an aperture located between the portion of the first conductive plate where the first external connection terminal is connected and a portion of the first conductive plate where the second semiconductor chip is connected, an arrangement of the first, second, and third semiconductor chips is substantially symmetric about a symmetry plane that is perpendicular to the first conductive plate, the symmetry plane intersects with the portion of the first conductive plate where the first external connection terminal is connected, in a direction perpendicular to the symmetry plane, a dimension of the aperture is larger than a dimension of the second semiconductor chip, and in the direction perpendicular to the symmetry plane, the dimension of the aperture is larger than a dimension of the portion of the first conductive plate where the first external connection terminal is connected.

2. The semiconductor device according to claim 1, wherein the aperture is configured such that at least a part of a current flowing between the first external connection terminal and the second semiconductor chip skirts around the aperture.

3. The semiconductor device according to claim 2, wherein the aperture is configured such that all the current flowing between the first external connection terminal and the second semiconductor chip skirts around the aperture.

4. The semiconductor device according to claim 1, wherein the aperture has a mouth that is symmetric about the symmetry plane.

5. The semiconductor device according to claim 1, wherein the aperture has a shape of slot, a longitudinal axis of which is perpendicular to the symmetry plane.

6. The semiconductor device according to claim 1, wherein in a direction perpendicular to the symmetry plane, a dimension of the aperture is smaller than a distance between a center of the first semiconductor chip and a center of the third semiconductor chip.

7. The semiconductor device according to claim 1, wherein the portion of the first conductive plate where the first external connection terminal is connected is symmetric about the symmetry plane.

8. The semiconductor device according to claim 1, wherein the first conductive plate comprises an expanded portion, a dimension of which in a direction perpendicular to the symmetry plane becomes larger from the portion of the first conductive plate where the first external connection terminal is connected towards a portion of the first conductive plate where the plurality of semiconductor chips is connected, and the aperture is at least partly located within the expanded portion.

9. The semiconductor device according to claim 1, wherein the first, second and third semiconductor chips are arranged linearly along a direction perpendicular to the symmetry plane.

10. The semiconductor device according to claim 1, wherein the first conductive plate is an insulated substrate comprising an inner conductor layer, an outer conductor layer, and an insulator layer disposed between the inner conductor layer and the outer conductor layer, the first external connection terminal is electrically connected to the plurality of semiconductor chips via the inner conductor layer, and the aperture is provided in the inner conductor layer.

11. The semiconductor device according to claim 10, wherein the aperture is provided only in the inner conductor layer and comprises a bottom surface defined by the insulator layer.

12. The semiconductor device according to claim 10, wherein each of the inner conductor layer and the outer conductor layer is a metal layer, and the insulator layer is a ceramic substrate.

13. The semiconductor device according to claim 10, wherein the insulated substrate is a DBC (Direct Bonded Copper) substrate.

14. The semiconductor device according to claim 1, further comprising a second conductive plate opposed to the first conductive plate and connected to each of the plurality of semiconductor chips.

15. The semiconductor device according to claim 14, further comprising at least one second external connection terminal connected to the second conductive plate.

16. The semiconductor device according to claim 15, wherein the at least one second external connection terminal includes two second external connection terminals.

17. The semiconductor device according to claim 16, wherein one of the two second external connection terminals is connected to the second conductive plate on one side relative to the symmetry plane, and another one of the two second external connection terminals is connected to the second conductive plate on another side relative to the symmetry plane.

18. The semiconductor device according to claim 17, wherein an arrangement of the two second external connection terminals is substantially symmetric about the symmetry plane.

19. The semiconductor device according to claim 15, wherein in a plan view along a direction perpendicular to the first and second conductive plates, an area of the second conductive plate is larger than an area of the first conductive plate.

20. The semiconductor device according to claim 15, wherein the first conductive plate comprises an expanded portion, and in a plan view along a direction perpendicular to the first and second conductive plates, a width of the expanded portion becomes larger from the portion of the first conductive plate where the first external connection terminal is connected towards a portion of the first conductive plate where the plurality of semiconductor chips is connected.

21. The semiconductor device according to claim 20, wherein a thickness of the expanded portion of the first conductive plate is smaller than a thickness of the portion of the first conductive plate where the plurality of semiconductor chips is connected, and the expanded portion is covered by an encapsulant.

22. The semiconductor device according to claim 20, wherein the expanded portion comprises a pair of side edges, each of the side edges extending from its base end located close to the plurality of semiconductor chips to its distal end located close to the first external connection terminal, and the base ends of the side edges of the expanded portion are farther apart from the first external connection terminal than a side edge of the at least one second external connection terminal located close to the first external connection terminal.

23. The semiconductor device according to claim 20, wherein at least a part of the expanded portion faces the at least one second external connection terminal.

24. The semiconductor device according to claim 14, wherein each of the first, second, and third semiconductor chips comprises an IGBT (Insulated Gate Bipolar Transistor) provided with an emitter and a collector, and
the emitters are electrically connected to the first conductive plate and the collectors are electrically connected to the second conductive plate.

25. The semiconductor device according to claim 15, wherein
the second conductive plate is an insulated substrate comprising an inner conductor layer, an outer conductor layer, and an insulator layer disposed between the inner conductor layer and the outer conductor layer, and
the at least one second external connection terminal is electrically connected to the plurality of semiconductor chips via the inner conductor layer of the second conductive plate.

* * * * *